United States Patent
Lin et al.

(10) Patent No.: US 9,913,385 B2
(45) Date of Patent: Mar. 6, 2018

(54) METHODS OF MAKING STACKABLE WIRING BOARD HAVING ELECTRONIC COMPONENT IN DIELECTRIC RECESS

(71) Applicant: BRIDGE SEMICONDUCTOR CORPORATION, Taipei (TW)

(72) Inventors: Charles W. C. Lin, Singapore (SG); Chia-Chung Wang, Hsinchu County (TW)

(73) Assignee: BRIDGE SEMICONDUCTOR CORPORATION, Taipei (TW)

( * ) Notice: Subject to any disclaimer, the term of this patent is extended or adjusted under 35 U.S.C. 154(b) by 244 days.

(21) Appl. No.: 14/957,954

(22) Filed: Dec. 3, 2015

(65) Prior Publication Data

US 2017/0034923 A1 Feb. 2, 2017

Related U.S. Application Data

(60) Provisional application No. 62/198,058, filed on Jul. 28, 2015.

(51) Int. Cl.
  H05K 3/30 (2006.01)
  H05K 3/40 (2006.01)
  H05K 1/18 (2006.01)
  H05K 3/46 (2006.01)

(52) U.S. Cl.
  CPC .......... *H05K 3/4038* (2013.01); *H05K 1/185* (2013.01); *H05K 3/4605* (2013.01); *H05K 3/4647* (2013.01); *H05K 3/4679* (2013.01); *H01L 2224/04105* (2013.01); *H01L 2224/18* (2013.01); *H01L 2224/92144* (2013.01); *H01L 2924/15153* (2013.01); *H05K 3/4015* (2013.01); *H05K 3/4697* (2013.01); *H05K 2201/096* (2013.01); *H05K 2201/09036* (2013.01); *H05K 2203/167* (2013.01); *H05K 2203/308* (2013.01)

(58) Field of Classification Search
  CPC ............. H01L 2224/97; H01L 2224/81; H01L 21/561; H01L 2224/81005; H01L 23/49827; H01L 23/49838; H01L 2924/15313; H05K 1/185; H05K 2201/09036; H05K 2201/096; H05K 2203/167; H05K 2203/308; H05K 3/4015; H05K 3/4038; H05K 3/4605; H05K 3/4647
  See application file for complete search history.

(56) References Cited

U.S. PATENT DOCUMENTS 6,955,948 B2 10/2005 Asahi et al.
8,072,059 B2 12/2011 Shim et al.
8,193,034 B2 6/2012 Pagaila et al.
(Continued)

*Primary Examiner* — Minh Trinh
(74) *Attorney, Agent, or Firm* — Pai Patent & Trademark Law Firm; Chao-Chang David Pai

(57) ABSTRACT

A method of making a stackable wiring board is characterized by positioning an electronic component in a dielectric recess to realize the thickness reduction of the wiring board and sidewalls of the recess can confine the dislocation of the electronic component to avoid misalignment between buildup circuitry and the electronic component. An array of metal posts that provide vertical electrical connections are formed by using the same metal carrier that forms the recess, so that the predetermined distance and relative location between metal posts and pads/bumps of the electronic component can be maintained.

5 Claims, 18 Drawing Sheets

(56) References Cited

U.S. PATENT DOCUMENTS

| | | | |
|---|---|---|---|
| 8,354,746 | B2 | 1/2013 | Huang et al. |
| 8,383,457 | B2 | 2/2013 | Pagaila et al. |
| 8,501,544 | B2 | 8/2013 | Pagaila |
| 8,525,337 | B2 | 9/2013 | Pendse |
| 8,536,715 | B2 | 9/2013 | Chino |
| 9,491,865 | B1 * | 11/2016 | Chen .................. H05K 1/185 |
| 2016/0204056 | A1 * | 7/2016 | Lin .................. H01L 21/4853 |
| | | | 174/255 |
| 2017/0033082 | A1 * | 2/2017 | Lin .................. H01L 25/0657 |
| 2017/0033083 | A1 * | 2/2017 | Lin .................. H01L 23/49838 |
| 2017/0034923 | A1 * | 2/2017 | Lin .................. H05K 3/4038 |

\* cited by examiner

METHODS OF MAKING STACKABLE WIRING BOARD HAVING ELECTRONIC COMPONENT IN DIELECTRIC RECESS

CROSS REFERENCE TO RELATED APPLICATIONS

This application claims the benefit of filing date of U.S. Provisional Application Ser. No. 62/198,058 filed Jul. 28, 2015. The entirety of said Provisional application is incorporated herein by reference.

FIELD OF THE INVENTION

The present invention relates to methods of making a wiring board, more particularly, to a method of making a stackable wiring board having an electronic component confined in a recess of a dielectric base and the component-in-recess is surrounded by an array of metal posts or plated through holes that provide vertical connection for the board.

DESCRIPTION OF RELATED ART

Market trends of multimedia devices demand for faster and slimmer designs. One of the approaches is to embed an electronic device in a wiring board so that the electrical performance of the board can be improved and/or another device(s) can be assembled on the board to form a 3D stacking structure. U.S. Pat. Nos. 8,193,034, 8,354,746, 8,383,457 and 8,525,337 disclose various wiring boards having an embedded device and metal pillars/posts for such kind of purpose. However, it is extremely difficult to place an electronic device at a pre-designated location with micron-scale accuracy if the device is attached to a dielectric layer by an adhesive as described in U.S. Pat. Nos. 8,536,715 and 8,501,544. A minor dislocation of the device due to adhesive curing or poor binding strength may lead to I/O disconnection, device failure and low manufacturing yield. Alternatively, an electronic device can be affixed to a metallized circuitry formed on a dielectric layer to avoid device shifting, as described in U.S. Pat. Nos. 8,072,059 and 6,955,948. Since the soldering process allows for self-alignment, device shifting and misalignment problems can be largely resolved. However, as the protruded bump of the embedded device causes undesirable increase in board thickness, the soldering approach usually does not meet stringent requirements for portables.

For the reasons stated above, and for other reasons stated below, an urgent need exists to develop a new wiring board having embedded electronic component that can address ultra-high packaging density, high signal integrity, low profile and high manufacturing yield issues.

SUMMARY OF THE INVENTION

A primary objective of the present invention is to provide a stackable wiring board having a recess in a dielectric base to accommodate an electronic component so as to realize the thickness reduction of the stackable wiring board.

Another objective of the present invention is to provide a stackable wiring board in which sidewalls of a recess can serve as dislocation controller for an electronic component in the recess so as to ensure the placement accuracy of the component.

Yet another objective of the present invention is to provide a stackable wiring board having a recess and an array of metal posts, and both the metal posts and the recess are formed by using a same metal carrier so as to ensure the predetermined distance and relative location between metal posts and pads/bumps of the electronic component can be maintained.

In accordance with the foregoing and other objectives, the present invention provides a method of making a stackable wiring board, comprising steps of: providing a metal carrier having substantially parallel first and second surfaces in opposite first and second directions, respectively; forming a protruded metal platform from the first surface of the metal carrier; forming a dielectric base covering the protruded metal platform and the remaining first surface of the metal carrier, wherein the dielectric base has a first surface apart from the metal carrier and is substantially parallel to the first and second surfaces of the metal carrier and an opposite second surface adjacent to the metal carrier; forming an array of metal posts over the second surface of the dielectric base by removing a portion of the metal carrier; forming a recess in the dielectric base by removing the protruded metal platform and a corresponding portion of the metal carrier, wherein the recess has a floor that is substantially parallel to the first surface of the dielectric base and a periphery defining interior sidewalls that extend from the floor to the second surface of the dielectric base; attaching an electronic component in the recess of the dielectric base by an adhesive, wherein the electronic component protrudes out from the recess and is substantially coplanar with the metal posts in the second direction, and the sidewalls of the recess confine the dislocation of the electronic component laterally; and forming a first buildup circuitry over the first surface of the dielectric base from the first direction and a second buildup circuitry over the electronic component and the metal posts from the second direction, wherein one of the first and second buildup circuitries is electrically coupled to the electronic component, and the first buildup circuitry is electrically connected to the second buildup circuitry and includes conductive vias in the dielectric base.

In another aspect, the present invention provides a method of making another stackable wiring board, comprising steps of: providing a metal carrier having substantially parallel first and second surfaces in opposite first and second directions, respectively; forming a protruded metal platform from the first surface of the metal carrier; forming a dielectric base covering the protruded metal platform and the remaining first surface of the metal carrier, wherein the dielectric base has a first surface apart from the metal carrier and is substantially parallel to the first and second surfaces of the metal carrier and an opposite second surface adjacent to the metal carrier; forming a recess in the dielectric base by removing the protruded metal platform and a corresponding portion of the metal carrier, wherein the recess has a floor and sidewalls that extend from the floor to the second surface of the dielectric base; attaching an electronic component in the recess of the dielectric base by an adhesive, wherein the electronic component protrudes out from the recess and the sidewalls of the recess confine the dislocation of the electronic component laterally; forming a first buildup circuitry over the first surface of the dielectric base from the first direction and a second buildup circuitry over the electronic component from the second direction, wherein one of the first and second buildup circuitries is electrically coupled to the electronic component; and forming plated through holes that extend from the first buildup circuitry to the second buildup circuitry and provide vertical electrical connections between the first buildup circuitry and the second buildup circuitry.

Unless specifically indicated or using the term "then" between steps, or steps necessarily occurring in a certain order, the sequence of the above-mentioned steps is not limited to that set forth above and may be changed or reordered according to desired design.

The methods of making a stackable wiring board according to the present invention have numerous advantages. For instance, inserting the electronic component into the recess of the dielectric base is particularly advantageous as the minimal height of the metal posts needed for the vertical connection between the dual buildup circuitries at both opposite sides of the electronic component can be reduced by an amount equal to the depth of the recess. Additionally, the recess can ensure the placement accuracy of the electronic component to avoid micro-via connection failure in the subsequent formation of the buildup circuitries.

These and other features and advantages of the present invention will be further described and more readily apparent from the detailed description of the preferred embodiments which follows.

BRIEF DESCRIPTION OF THE DRAWINGS

The following detailed description of the preferred embodiments of the present invention can best be understood when read in conjunction with the following drawings, in which.

DETAILED DESCRIPTION OF THE PREFERRED EMBODIMENTS

Hereafter, examples will be provided to illustrate the embodiments of the present invention. Advantages and effects of the invention will become more apparent from the disclosure of the present invention. It should be noted that these accompanying figures are simplified and illustrative. The quantity, shape and size of components shown in the figures may be modified according to practical conditions, and the arrangement of components may be more complex. Other various aspects also may be practiced or applied in the invention, and various modifications and variations can be made without departing from the spirit of the invention based on various concepts and applications.

Embodiment 1

FIGS. 1-15 are schematic views showing a method of making a wiring board that includes a dielectric base, metal posts, a stiffener, an electronic component and dual buildup circuitries in accordance with the first embodiment of the present invention.

Figure 1:
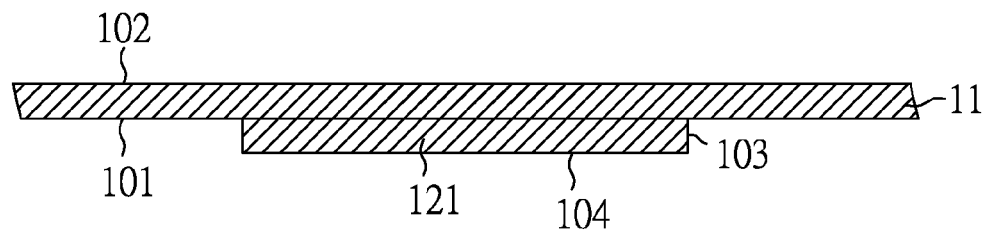
FIGS. 1 and 2 are cross-sectional and bottom perspective views, respectively, of a protruded metal platform formed on a metal carrier in accordance with the first embodiment of the present invention.
Figure 2:
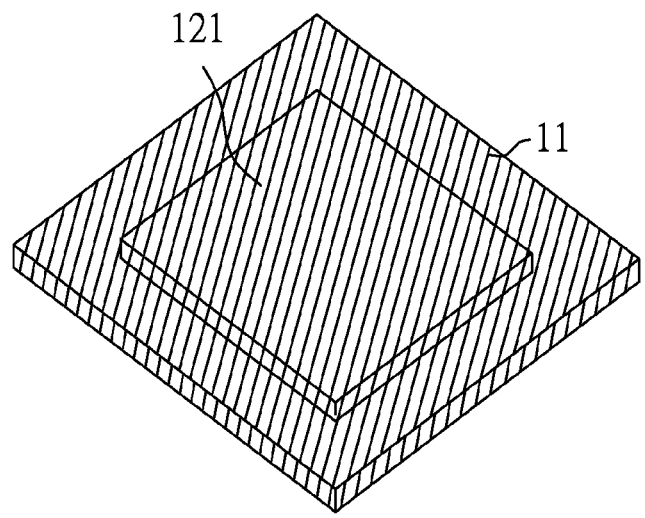

FIGS. 1 and 2 are cross-sectional and bottom perspective views, respectively, of the structure with a protruded metal platform 121 formed on a metal carrier 11. The metal carrier 11 and the protruded metal platform 121 typically are made of copper, aluminum, nickel or other metals or alloys. The material of the protruded metal platform 121 may be the same as or different from that of the metal carrier 11. The thickness of the metal carrier 11 can range from 0.05 to 0.5 mm (preferably from 0.1 to 0.2 mm), whereas the thickness of the protruded metal platform 121 can range from 10 to 100 microns. In this embodiment, the metal carrier 11 is made of copper and has a thickness of 0.125 mm, whereas the protruded metal platform 121 is made of copper and has s thickness of 50 microns. The metal carrier 11 has substantially parallel and opposite first and second surfaces 101, 102 in the downward and upward directions, respectively. The protruded metal platform 121 can be formed on the first surface 101 of the metal carrier 11 by pattern deposition, such as electroplating, electroless plating, evaporating, sputtering or their combinations, or by etching or mechanical carving. The protruded metal platform 121 has a periphery defining exterior side walls 103 and a flat surface 104 that is substantially parallel to the first and second surfaces 101, 102 of the metal carrier 11.

Figure 3:
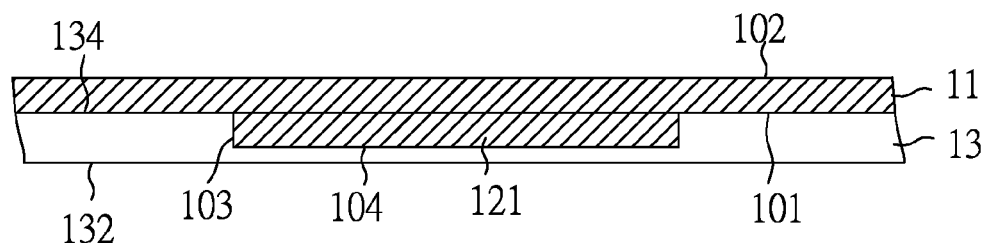
FIG. 3 is a cross-sectional view of the structure of FIG. 1 provided with a dielectric base in accordance with the first embodiment of the present invention.

FIG. 3 is a cross-sectional view of the structure with a dielectric base 13 on the metal carrier 11 and the protruded metal platform 121. The dielectric base 13 is deposited typically by lamination or coating, and can be made of epoxy resin, glass-epoxy, polyimide, or the like. The dielectric base 13 contacts and covers and extends laterally on the remaining first surface 101 of the metal carrier 11 and the flat surface 104 of the protruded metal platform 121 from below, and surrounds and conformally coats side walls 103 of the protruded metal platform 121 in the lateral directions. As a result, the dielectric base 13 has a first surface 132 apart from the metal carrier 11 and substantially parallel to the first surface 101 and second surface 102 of the metal carrier 11 and an opposite second surface 134 adjacent to and in contact with the metal carrier 11.

Figure 4:
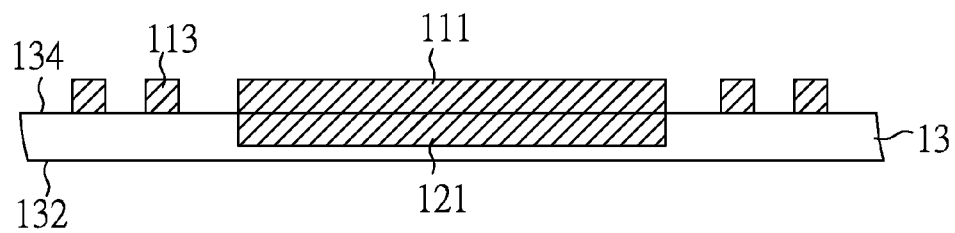
FIGS. 4 and 5 are cross-sectional and top perspective views, respectively, showing a selected portion of the metal carrier is removed from the structure of FIG. 3 in accordance with the first embodiment of the present invention.
Figure 5:
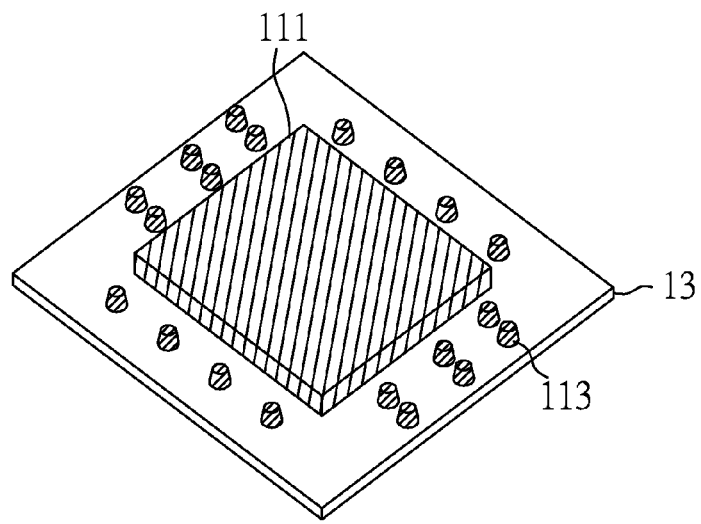

FIGS. 4 and 5 are cross-sectional and top perspective views, respectively, of the structure with a metal slug 111 and an array of metal posts 113 formed by removing a selected portion of the metal carrier 11 using, for example, photolithography and wet etching. The metal slug 111 covers the protruded metal platform 121 from above, and the metal posts 113 are located on the second surface 134 of the dielectric base 13.

Figure 6:
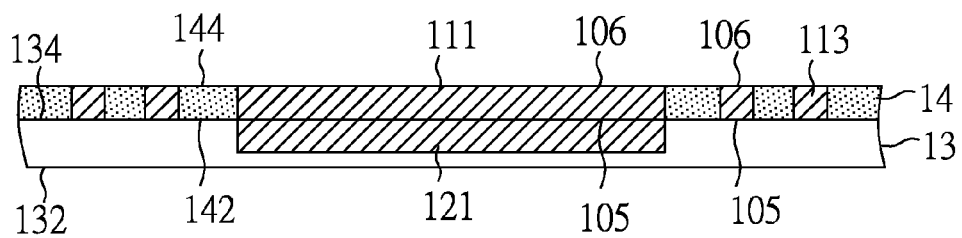
FIG. 6 is a cross-sectional view showing the structure of FIG. 4 is provided with a stiffener in accordance with the first embodiment of the present invention.

FIG. 6 is a cross-sectional view of the structure with a stiffener 14 on the exposed second surface 134 of the dielectric base 13. The stiffener 14 is formed typically by printing or molding of resin sealant to cover the second surface 134 of the dielectric base 13 from above and to surround and conformally coat and cover sidewalls of the metal slug 111 and the metal posts 113 in the lateral directions. In this illustration, the stiffener 14 has a thickness equal to that of the metal slug 111 and the metal posts 113. As a result, the stiffener 14 has a first surface 142 substantially coplanar with the first surfaces 105 of the metal slug 111 and the metal posts 113 in the downward direction, and a second surface 144 substantially coplanar with the second surfaces 106 of the metal slug 111 and the metal posts 113 in the upward direction.

Figure 7:
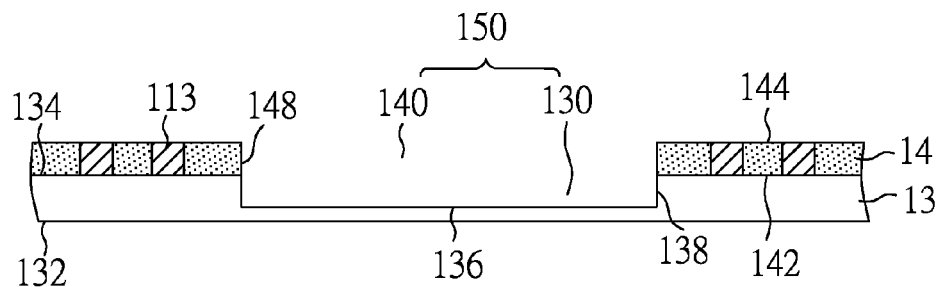
FIGS. 7 and 8 are cross-sectional and top perspective views, respectively, showing the structure of FIG. 6 is provided with a recess in accordance with the first embodiment of the present invention.
Figure 8:
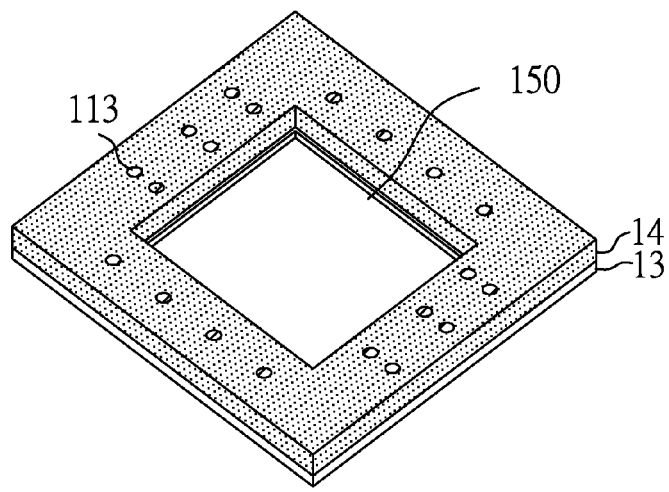

FIGS. 7 and 8 are cross-sectional and top perspective views, respectively, of the structure after removal of the metal slug 111 and the protruded metal platform 121. The metal slug 111 and the protruded metal platform 121 can be removed by numerous techniques including wet chemical etching, electro-chemical etching or laser. As a result, a placement area 150 is formed and consists of a recess 130 and an aperture 140. The recess 130 in the dielectric base 13 has a floor 136 that is substantially parallel to the first surface 132 of the dielectric base 13 and a periphery defining interior sidewalls 138 that extend from the floor 136 to the second surface 134 of the dielectric base 13, whereas the aperture 140 has sidewalls 148 that extend from the first surface 142 to the second surface 144 of the stiffener 14 and are flush with the sidewalls 138 of the recess 130.

Figure 9:
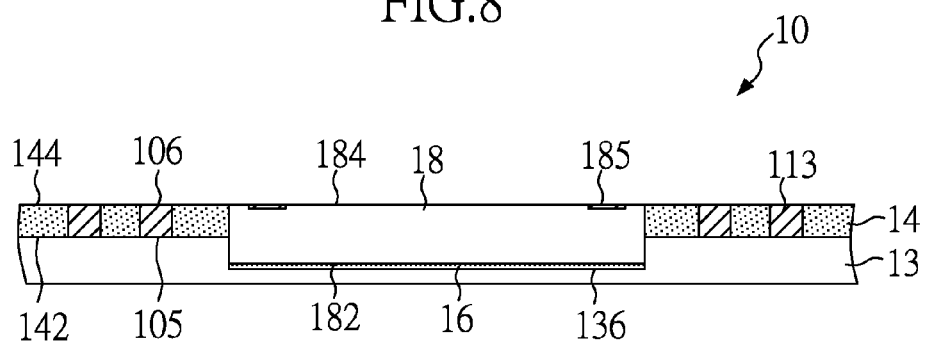
FIG. 9 is a cross-sectional view showing the structure of FIG. 7 is provided with an electronic component to finish the fabrication of a component-in-recess subassembly in accordance with the first embodiment of the present invention.

FIG. 9 is a cross-sectional view of the structure with an electronic component 18 placed in the placement area 150. The electronic component 18 is inserted into the placement area 150 and attached to the floor 136 of the recess 130 by an adhesive 16. The sidewalls 138, 148 of the recess 130 and the aperture 140 are laterally aligned with and in close proximity to peripheral edges of the electronic component 18 and confine the dislocation of the electronic component 18 laterally. In this embodiment, the electronic component 18 is illustrated as a bare chip and has a first surface 182 facing the dielectric base 13 and in contact with the adhesive 16, a second surface 184 substantially coplanar with the second surface 106 of the metal posts 16 and the second surface 144 of the stiffener 14 in the upward direction, and contact pads 185 at the second surface 184.

At this stage, a component-in-recess subassembly 10 is accomplished and includes a dielectric base 13, an array of metal posts 113, a stiffener 14 and an electronic component 18. As an example, the component-in-recess subassembly 10 can be used to fabricate a wiring board with dual buildup circuitries as follows.

Figure 10:
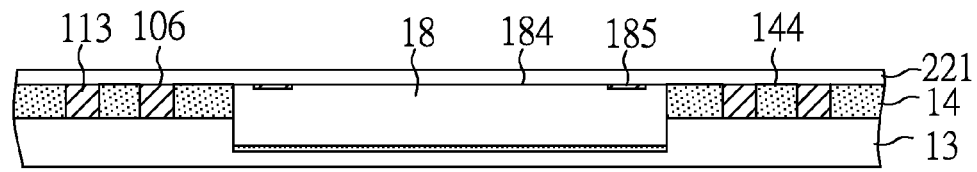
FIG. 10 is a cross-sectional view showing the structure of FIG. 9 is provided with a dielectric layer in accordance with the first embodiment of the present invention.

FIG. 10 is a cross-sectional view of the structure with a second dielectric layer 221 laminated/coated on the metal posts 113, the stiffener 14 and the electronic component 18 from above. The second dielectric layer 221 contacts and covers and extends laterally on the second surface 106 of the metal posts 113, the second surface 144 of the stiffener 14 and the second surface 184 of the electronic component 18. In this embodiment, the second dielectric layer 221 typically has a thickness of 50 microns and can be made of epoxy resin, glass-epoxy, polyimide, and the like.

Figure 11:
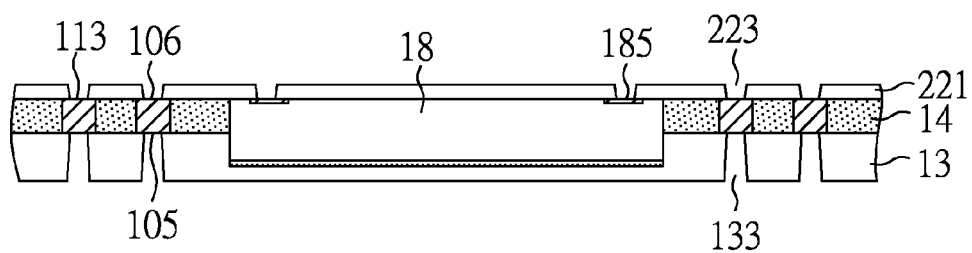
FIG. 11 is a cross-sectional view showing the structure of FIG. 10 is provided with via openings in accordance with the first embodiment of the present invention.

FIG. 11 is a cross-sectional view of the structure provided with first via openings 133 and second via openings 223. The first via openings 133 extend through the dielectric base 13 and are aligned with and expose selected portions of the metal posts 113 in the downward direction. The second via openings 223 extend through the second dielectric layer 221 and are aligned with and expose selected portions of the metal posts 113 and the contact pads 185 of the electronic component 18 in the upward direction. The first and second via openings 133, 223 may be formed by numerous techniques including laser drilling, plasma etching and photolithography, and typically have a diameter of 50 microns. Laser drilling can be enhanced by a pulsed laser. Alternatively, a scanning laser beam with a metal mask can be used. For instance, copper can be etched first to create a metal window followed by laser.

Figure 12:
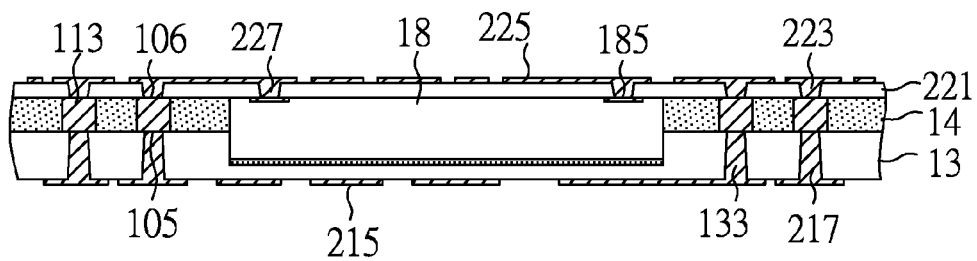
FIG. 12 is a cross-sectional view showing the structure of FIG. 11 is provided with conductive traces in accordance with the first embodiment of the present invention.

Referring now to FIG. 12, first conductive traces 215 and second conductive traces 225 are respectively formed on the dielectric base 13 and the second dielectric layer 221 by metal deposition and metal patterning process. The first conductive traces 215 extend from the first surface 105 of the metal posts 113 in the downward direction, fill up the first via openings 133 to form first conductive vias 217 in direct contact with the metal posts 113, and extend laterally on the dielectric base 13. The second conductive traces 225 extend from the second surface 106 of the metal posts 113 and the contact pads 185 of the electronic component 18 in the upward direction, fill up the second via openings 223 to form second conductive vias 227 in direct contact with the metal posts 113 and the contact pads 185, and extend laterally on the second dielectric layer 221. As a result, the first and second conductive traces 215, 225 can provide horizontal signal routing in both the X and Y directions and vertical routing through the first and second via openings 133, 223 and serve as electrical connections for the metal posts 113 and the electronic component 18.

The first and second conductive traces 215, 225 can be deposited as a single layer or multiple layers by any of numerous techniques, such as electroplating, electroless plating, evaporating, sputtering, or their combinations. For instance, they can be deposited by first dipping the structure in an activator solution to render the dielectric base 13 and the second dielectric layer 221 catalytic to electroless copper, and then a thin copper layer is electrolessly plated to serve as the seeding layer before a second copper layer is electroplated on the seeding layer to a desirable thickness. Alternatively, the seeding layer can be formed by sputtering a thin film such as titanium/copper before depositing the electroplated copper layer on the seeding layer. Once the desired thickness is achieved, the plated layer can be patterned to form the first and second conductive traces 215, 225 by any of numerous techniques including wet etching, electro-chemical etching, laser-assist etching, and their combinations, with an etch mask (not shown) thereon that defines the first and second conductive traces 215, 225.

Figure 13:
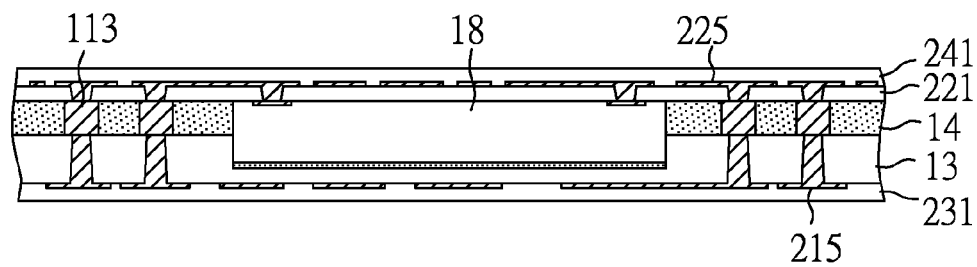
FIG. 13 is a cross-sectional view showing the structure of FIG. 12 is provided with dielectric layers in accordance with the first embodiment of the present invention.

FIG. 13 is a cross-sectional view of the structure with a third dielectric layer 231 laminated/coated on the dielectric base 13 and the first conductive traces 215 from below, and a fourth dielectric layer 241 laminated/coated on the second dielectric layer 221 and the second conductive traces 225 from above. The third dielectric layer 231 contacts and covers and extends laterally on the dielectric base 13 and the first conductive traces 215 from below. The fourth dielectric layer 241 contacts and covers and extends laterally on the second dielectric layer 221 and the second conductive traces 225 from above. The third and fourth dielectric layers 231, 241 can be formed of epoxy resin, glass-epoxy, polyimide and the like and typically has a thickness of 50 microns.

Figure 14:
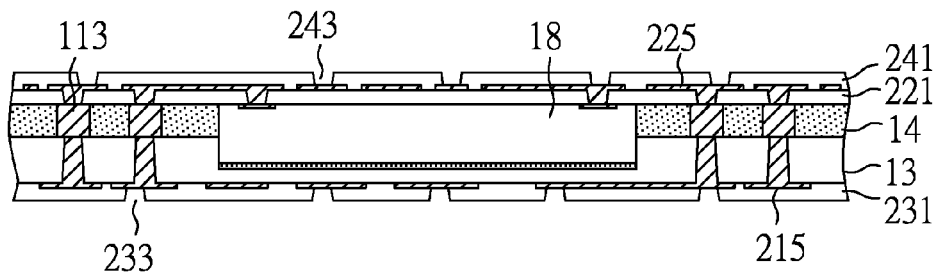
FIG. 14 is a cross-sectional view showing the structure of FIG. 13 is provided with via openings in accordance with the first embodiment of the present invention.

FIG. 14 is a cross-sectional view of the structure provided with third and fourth via openings 233, 243. The third via openings 233 extend through the third dielectric layer 231 to expose selected portions of the first conductive traces 215 in the downward direction. The fourth via openings 243 extend through the fourth dielectric layer 241 to expose selected portions of the second conductive traces 225 in the upward direction. Like the first and second via openings 133, 223, the third and fourth via openings 233, 243 can be formed by any of numerous techniques including laser drilling, plasma etching and photolithography and typically have a diameter of 50 microns.

Figure 15:
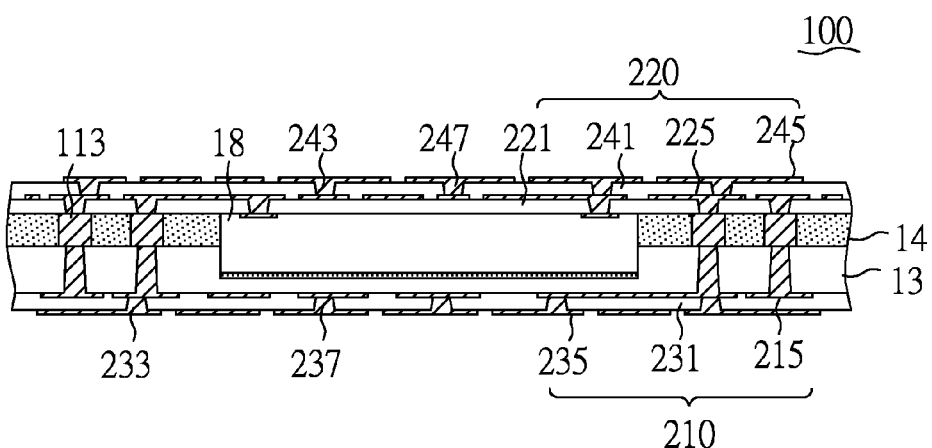
FIG. 15 is a cross-sectional view showing the structure of FIG. 14 is provided with conductive traces to finish the fabrication of a wiring board in accordance with the first embodiment of the present invention.

FIG. 15 is a cross-sectional view of the structure provided with third and fourth conductive traces 235, 245 on the third and fourth dielectric layer 231, 241 by metal deposition and metal patterning process, respectively. The third conductive traces 235 extend from the first conductive traces 215 in the downward direction, fill up the third via openings 233 to form third conductive vias 237 in direct contact with the first conductive traces 215, and extend laterally on the third dielectric layer 231. The fourth conductive traces 245 extend from the second conductive traces 225 in the upward direction, fill up the fourth via openings 243 to form fourth conductive vias 247 in direct contact with the second conductive traces 225, and extend laterally on the fourth dielectric layer 241.

Accordingly, as shown in FIG. 15, a wiring board 100 is accomplished and includes metal posts 113, a dielectric base 13, a stiffener 14, an electronic component 18, a first buildup circuitry 210 and a second buildup circuitry 220. In this illustration, the first buildup circuitry 210 includes first conductive traces 215, a third dielectric layer 231 and third conductive traces 235, whereas the second buildup circuitry 220 includes a second dielectric layer 221, second conductive traces 225, a fourth dielectric layer 241 and fourth conductive traces 245.

The electronic component 18 is face-up disposed in the recess 130 of the dielectric base 13 and protrudes out from the recess 130, with its second surface 184 being substantially coplanar with the second surface 106 of the metal posts 113 and the second surface 144 of the stiffener 14. The gap between the electronic component 18 and the sidewalls 138 of the recess 130 and the sidewalls 148 of the aperture 410 ranges from 5 to 50 microns. As such, the placement accuracy of the electronic component 18 can be provided by the sidewalls 138 of the recess 130 and the sidewalls 148 of the aperture 140, with the sidewalls 138 of the recess 130 extending beyond the first surface 182 of the electronic component 18 in the upward direction. The first buildup circuitry 210 is disposed on the first surface 132 of the dielectric base 13 and is electrically coupled to the metal posts 113 through the first conductive vias 217 in direct contact with the first surface 105 of the metal posts 113. The second buildup circuitry 220 is disposed on the second surface 106 of the metal posts 113, the second surface 144 of the stiffener 14 and the second surface 184 of the electronic component 18, and is electrically coupled to the metal posts 113 and the electronic component 18 through the second conductive vias 227 in direct contact with the contact pads 185 of the electronic component 18 and the second surface 106 of the metal posts 113. As a result, the first buildup circuitry 210 is electrically connected to the second buildup circuitry 220 by the first conductive vias 217 in the dielectric base 13 and the metal posts 113 in the stiffener 14, whereas the second buildup circuitry 220 provides fan-out routing for the electronic component 18.

Figure 16:
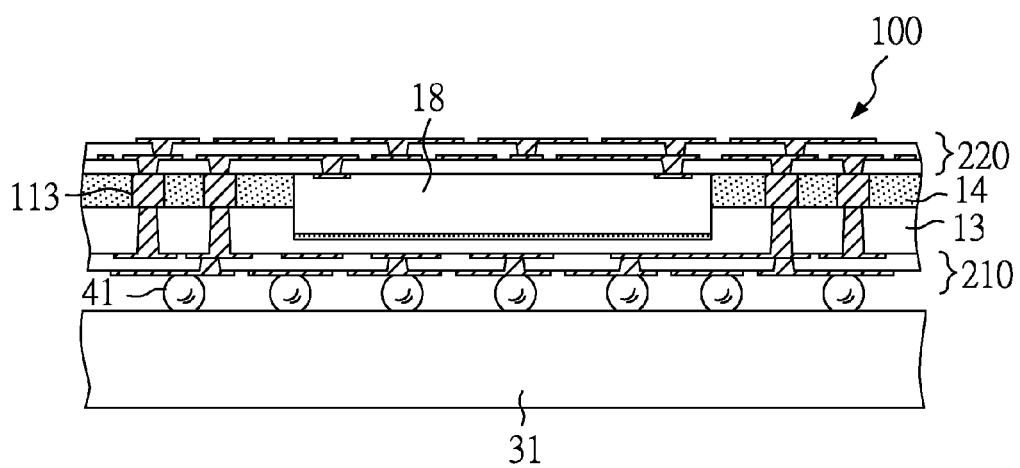
FIG. 16 is a cross-sectional view showing an electronic device is mounted on the wiring board of FIG. 15 in accordance with the first embodiment of the present invention.

FIG. 16 is a cross-sectional view of the structure provided with a semiconductor package 31 mounted on the wiring board 100 of FIG. 15. The semiconductor package 31 is electrically coupled to the first buildup circuitry 210 of the wiring board 100 via solder balls 41.

Embodiment 2

FIGS. 17-22 are schematic views showing a method of making a wiring board with the second buildup circuitry thermally conductible to the electronic component in accordance with the second embodiment of the present invention.

For purposes of brevity, any description in Embodiment 1 above is incorporated herein insofar as the same is applicable, and the same description need not be repeated.

Figure 17:
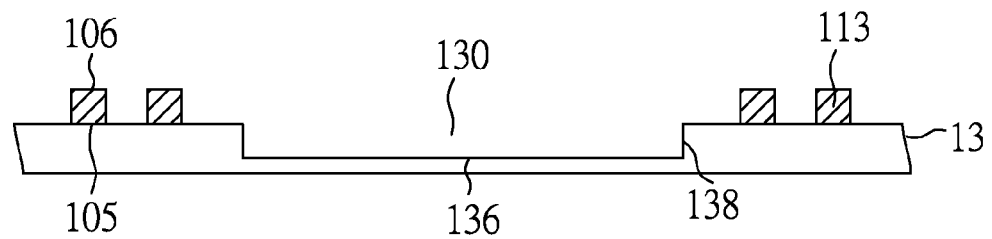
FIGS. 17 and 18 are cross-sectional and top perspective views, respectively, showing metal posts are formed on a dielectric base in accordance with the second embodiment of the present invention.
Figure 18:
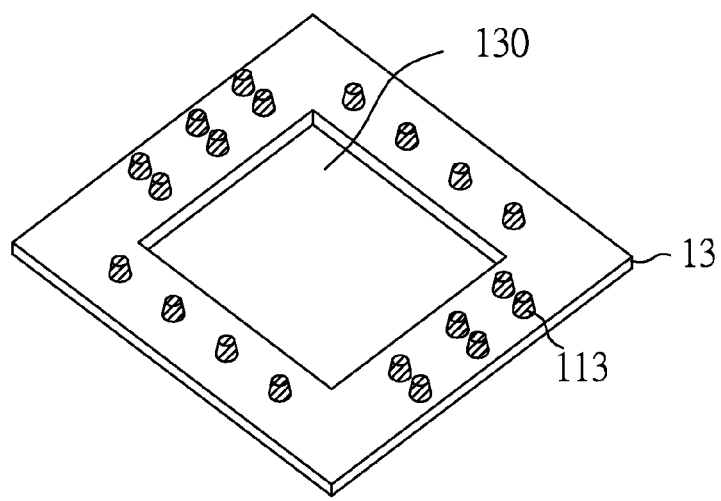

FIGS. 17 and 18 are cross-sectional and top perspective views, respectively, of the structure with metal posts 113 on a dielectric base 13. The structure is similar to that illustrated in FIG. 7, except that no stiffener is provided in this embodiment.

Figure 19:
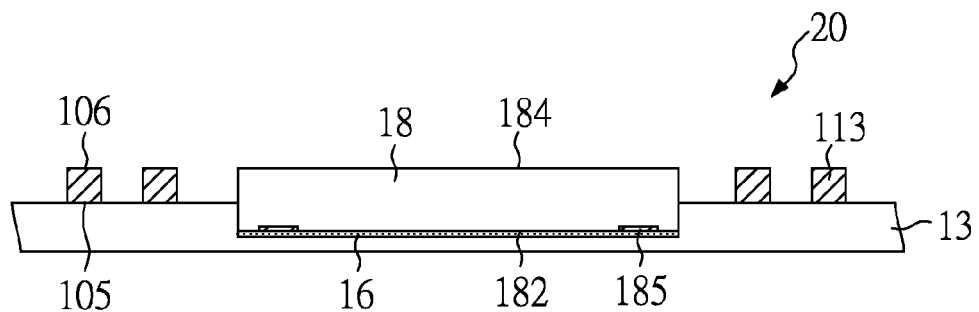
FIG. 19 is a cross-sectional view showing the structure of FIG. 17 is provided with an electronic component to finish the fabrication of a component-in recess subassembly in accordance with the second embodiment of the present invention.

FIG. 19 is a cross-sectional view of the structure with an electronic component 18 placed in the recess 130 of the dielectric base 13. The electronic component 18 is inserted into the recess 130 and attached to the floor 136 of the recess 130 by an adhesive 16. In this embodiment, the electronic component 18 is illustrated as a bare chip and has contact pads 185 at its first surface 182. The first surface 182 of the electronic component 18 faces the dielectric base 13 and contacts the adhesive 16, whereas the second surface 184 of the electronic component 18 is substantially coplanar with the second surface 106 of the metal posts 113. The sidewalls 138 of the recess 130 are laterally aligned with and in close proximity to peripheral edges of the electronic component 18 and confine the dislocation of the electronic component 18 laterally.

At this stage, a component-in-recess subassembly 20 is accomplished and includes metal posts 113, a dielectric base 13 and an electronic component 18. As an example, the component-in-recess subassembly 20 can be used to fabricate a wiring board with dual buildup circuitries as follows.

Figure 20:
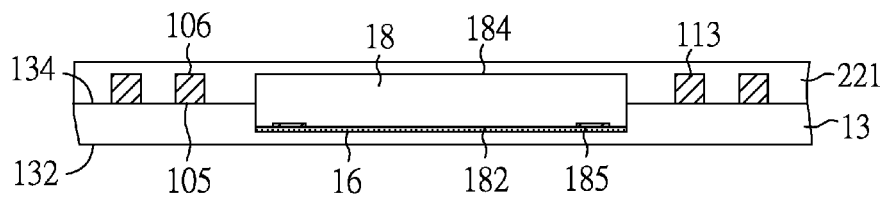
FIG. 20 is a cross-sectional view showing the structure of FIG. 19 is provided with a dielectric layer in accordance with the second embodiment of the present invention.

FIG. 20 is a cross-sectional view of the structure with a second dielectric layer 221 laminated/coated on the dielectric base 13, the metal posts 113 and the electronic component 18 from above. The second dielectric layer 221 contacts and covers the second surface 134 of the dielectric base 13, the second surface 106 of the metal posts 113 and the second surface 184 of the electronic component 18 from above, and surrounds and conformally coats sidewalls of the metal posts 113 and the electronic component 18 in lateral directions.

Figure 21:
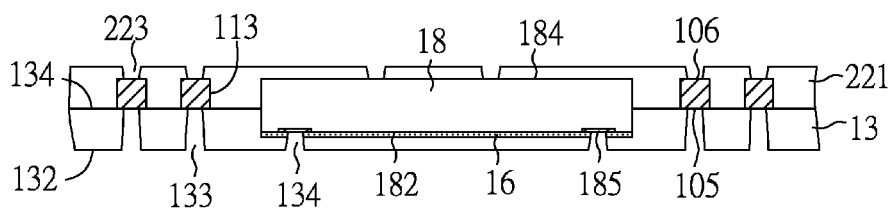
FIG. 21 is a cross-sectional view showing the structure of FIG. 20 is provided with via openings in accordance with the second embodiment of the present invention.

FIG. 21 is a cross-sectional view of the structure provided with first via openings 133, 134 and second via openings 223. The first via openings 133 extend through the dielectric base 13 and are aligned with and expose selected portions of the metal posts 113 in the downward direction, whereas the first via openings 134 extend through the dielectric base 13 and the adhesive 16 and are aligned with and expose the contact pads 185 of the electronic component 18 in the downward direction. The second via openings 223 extend through the second dielectric layer 221 and are aligned with and expose selected portions of the metal posts 113 and the second surface 184 of the electronic component 18 in the upward direction.

Figure 22:
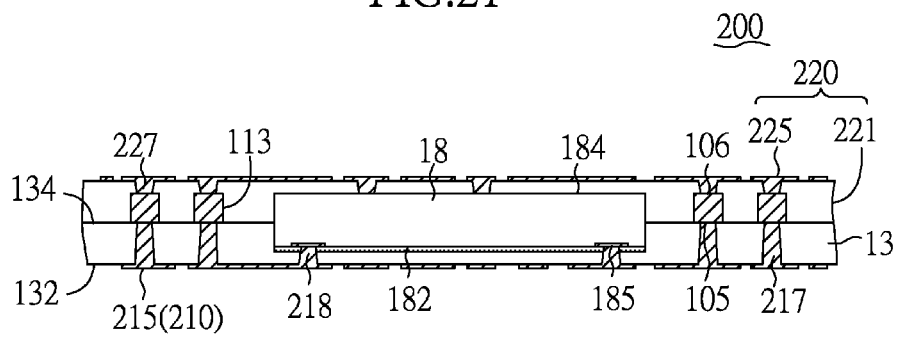
FIG. 22 is a cross-sectional view showing the structure of FIG. 21 is provided with conductive traces to finish the fabrication of a wiring board in accordance with the second embodiment of the present invention.

Referring now to FIG. 22, first conductive traces 215 and second conductive traces 225 are respectively formed on the dielectric base 13 and the second dielectric layer 221 by metal deposition and metal patterning process. The first conductive traces 215 extend from the contact pads 185 of the electronic component 18 and the first surface 105 of the metal posts 113 in the downward direction, fill up the first via openings 133, 134 to form first conductive vias 217, 218 in direct contact with the metal posts 113 and the contact pads 185 of the electronic component 18, and extend laterally on the dielectric base 13. The second conductive traces 225 extend from the second surface 106 of the metal posts 113 and the second surface 184 of the electronic component 18 in the upward direction, fill up the second via openings 223 to form second conductive vias 227 in direct contact with the metal posts 113 and the electronic component 18, and extend laterally on the second dielectric layer 221.

Accordingly, as shown in FIG. 22, a wiring board 200 is accomplished and includes metal posts 113, a dielectric base 13, an electronic component 18, a first buildup circuitry 210 and a second buildup circuitry 220. In this illustration, the first buildup circuitry 210 includes first conductive traces 215, whereas the second buildup circuitry 220 includes a second dielectric layer 221 and second conductive traces 225.

The electronic component 18 is face-down disposed in the recess 130 of the dielectric base 13 and protrudes out from the recess 130, with its second surface 184 substantially coplanar with the second surface 106 of the metal posts 113 in the upward direction. The first buildup circuitry 210 is disposed on the first surface 132 of the dielectric base 13 and is electrically coupled to the metal posts 113 and the electronic component 18 through the first conductive vias 217, 218 in direct contact with the first surface 105 of the metal posts 113 and the contact pads 185 of the electronic component 18, respectively. The second buildup circuitry 220 is disposed on the second surface 106 of the metal posts 113, the second surface 134 of the dielectric base 13 and the second surface 184 of the electronic component 18, and is electrically coupled to the metal posts 113 and thermally conductible to the electronic component 18 through the second conductive vias 227 in direct contact with the second surfaces 106 of the metal posts 113 and the second surface 184 of the electronic component 18.

Figure 23:
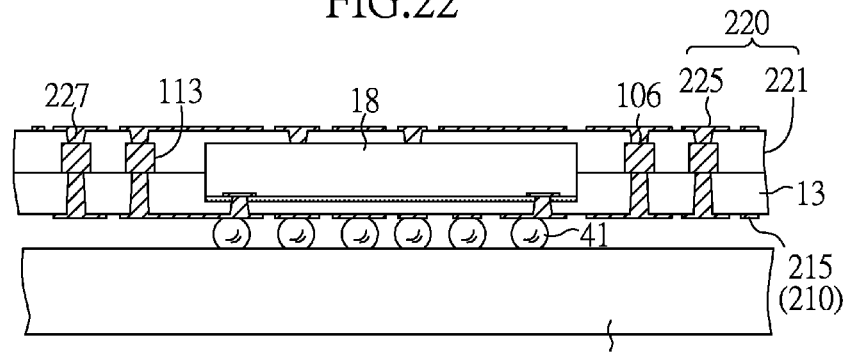
FIG. 23 is a cross-sectional view showing an electronic device is mounted on the wiring board of FIG. 22 in accordance with the second embodiment of the present invention.

FIG. 23 is a cross-sectional view of the structure provided with a semiconductor package 31 mounted on the wiring board 200 of FIG. 22. The semiconductor package 31 is electrically coupled to the first buildup circuitry 210 of the wiring board 200 via solder balls 41.

Embodiment 3

FIGS. 24-34 are schematic views showing a method of making a wiring board with a metal layer deposited in the recess in accordance with the third embodiment of the present invention.

For purposes of brevity, any description in the aforementioned Embodiments is incorporated herein insofar as the same is applicable, and the same description need not be repeated.

Figure 24:
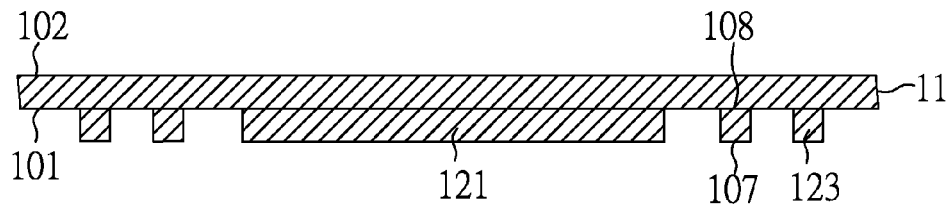
FIG. 24 is a cross-sectional view showing a protruded metal platform and auxiliary metal pads are formed on a metal carrier in accordance with the third embodiment of the present invention.

FIG. 24 is a cross-sectional view of the structure with a protruded metal platform 121 and an array of auxiliary metal pads 123 formed on a metal carrier 11. The protruded metal platform 121 and the auxiliary metal pads 123 extend from the first surface 101 of the metal carrier 11 in the downward direction. In this illustration, each of the auxiliary metal pads 123 is substantially coplanar with the protruded metal platform 121 at its first and second surfaces 107, 108. The auxiliary metal pads 123 can be made of the same material as the protruded metal platform 121, and may be formed by pattern deposition, such as electroplating, electroless plating, evaporating, sputtering or their combinations, or by etching or mechanical carving.

Figure 25:
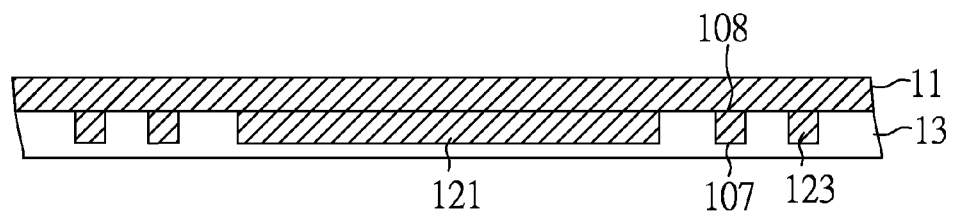
FIG. 25 is a cross-sectional view showing the structure of FIG. 24 is provided with a dielectric base in accordance with the third embodiment of the present invention.

FIG. 25 is a cross-sectional view of the structure with a dielectric base 13 on the metal carrier 11, the protruded metal platform 121 and the auxiliary metal pads 123. The dielectric base 13 contacts and covers the metal carrier 11, the protruded metal platform 121 and the auxiliary metal pads 123 from below, and surrounds and conformally coats side walls of the protruded metal platform 121 and the auxiliary metal pads 123 in the lateral directions.

Figure 26:
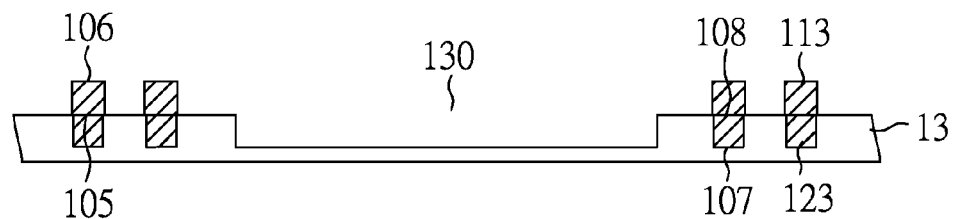
FIG. 26 is a cross-sectional view showing the structure of FIG. 25 is provided with a recess in accordance with the third embodiment of the present invention.

FIG. 26 is a cross-sectional view of the structure with a recess 130 and an array of metal posts 113 formed by removing a selected portion of the metal carrier 11 and the protruded metal platform 121. The metal posts 113 are aligned with and cover the auxiliary metal pads 123 in the upward direction and each has a first surface 105 in direct contact with the auxiliary metal pads 123. The diameter of the metal post 113 at its first surface 105 may be the same as or different from that of the auxiliary metal pad 123 at its second surface 108. Further, the recess 130 has a depth substantially equal to the thickness of the auxiliary metal pads 123.

Figure 27:
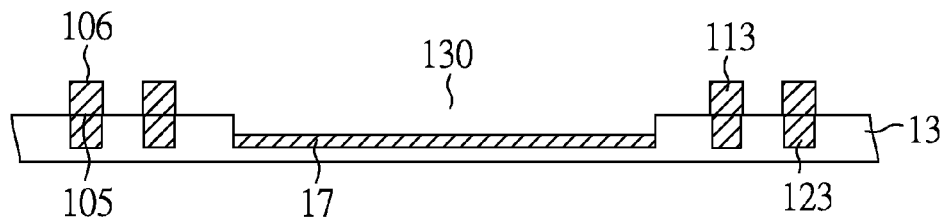
FIG. 27 is a cross-sectional view showing the structure of FIG. 26 is provided with a metal layer in accordance with the third embodiment of the present invention.

FIG. 27 is a cross-sectional view of the structure provided with a metal layer 17 on the floor 136 of the recess 130. The metal layer 17 is typically made of copper and can be deposited by numerous techniques, such as electroplating, electroless plating, evaporating, sputtering or their combinations.

Figure 28:
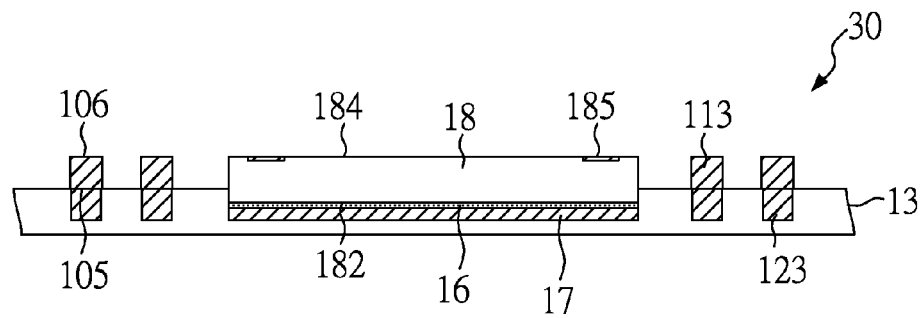
FIG. 28 is a cross-sectional view showing the structure of FIG. 27 is provided with an electronic component to finish the fabrication of a component-in-recess subassembly in accordance with the third embodiment of the present invention.

FIG. 28 is a cross-sectional view of the structure with an electronic component 18 placed in the recess 130 of the dielectric base 13. The electronic component 18 is inserted into the recess 130 and attached to the metal layer 17 by an adhesive 16 in contact with the first surface 182 of the electronic component 18 and the metal layer 17. In this embodiment, the electronic component 18 is illustrated as a bare chip and has contact pads 185 at its second surface 184 that is substantially coplanar with the second surface 106 of the metal posts 113.

At this stage, a component-in-recess subassembly 30 is accomplished and includes metal posts 113, auxiliary metal pads 123, a dielectric base 13, a metal layer 17 and an electronic component 18. As an example, the component-in-recess subassembly 30 can be used to fabricate a wiring board with dual buildup circuitries as follows.

Figure 29:
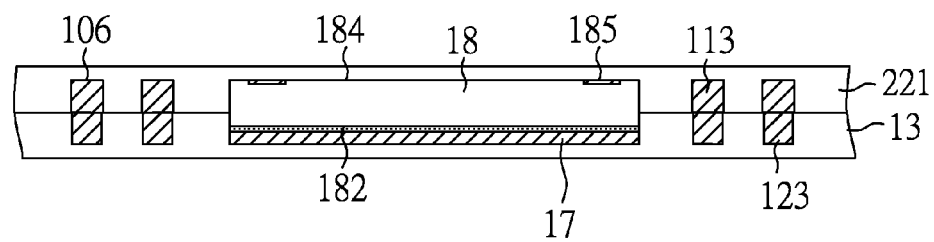
FIG. 29 is a cross-sectional view showing the structure of FIG. 28 is provided with a dielectric layer in accordance with the third embodiment of the present invention.

FIG. 29 is a cross-sectional view of the structure with a second dielectric layer 221 laminated/coated on the dielectric base 13, the metal posts 113 and the electronic component 18 from above. The second dielectric layer 221 contacts and covers the dielectric base 13, the metal posts 113 and the electronic component 18 from above, and surrounds and conformally coats sidewalls of the metal posts 113 and the electronic component 18.

Figure 30:
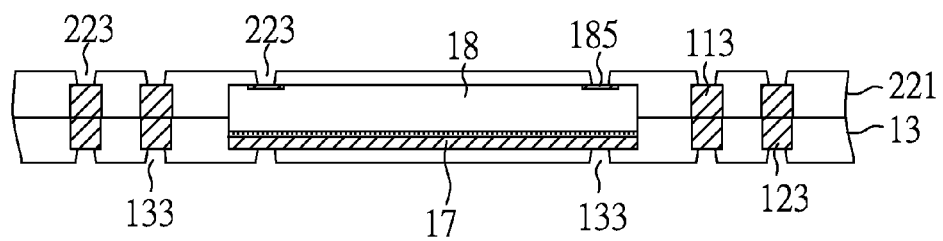
FIG. 30 is a cross-sectional view showing the structure of FIG. 29 is provided with via openings in accordance with the third embodiment of the present invention.

FIG. 30 is a cross-sectional view of the structure provided with first via openings 133 and second via openings 223. The first via openings 133 extend through the dielectric base 13 and are aligned with and expose selected portions of the auxiliary metal pads 123 and the metal layer 17 in the downward direction. The second via openings 223 extend through the second dielectric layer 221 and are aligned with and expose selected portions of the metal posts 113 and the contact pads 185 of the electronic component 18 in the upward direction.

Figure 31:
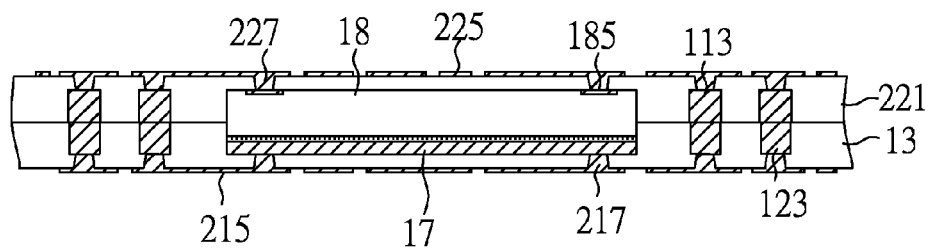
FIG. 31 is a cross-sectional view showing the structure of FIG. 30 is provided with conductive traces in accordance with the third embodiment of the present invention.

Referring now to FIG. 31, first conductive traces 215 and second conductive traces 225 are respectively formed on the dielectric base 13 and the second dielectric layer 221 by metal deposition and metal patterning process. The first conductive traces 215 extend from the auxiliary metal pads 123 and the metal layer 17 in the downward direction, fill up the first via openings 133 to form first conductive vias 217, and extend laterally on the dielectric base 13. The second conductive traces 225 extend from the metal posts 113 and the contact pads 185 of the electronic component 18 in the upward direction, fill up the second via openings 223 to form second conductive vias 227, and extend laterally on the second dielectric layer 221.

Figure 32:
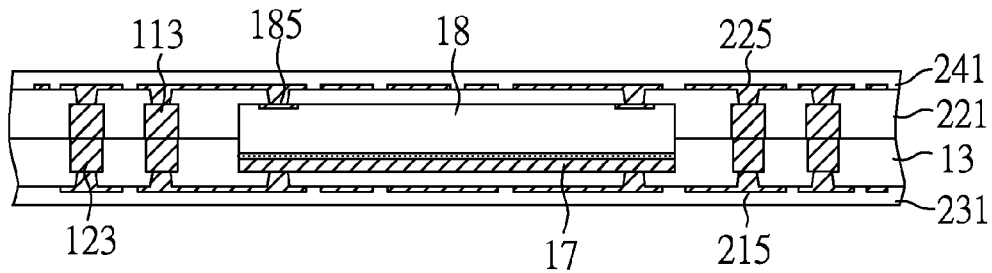
FIG. 32 is a cross-sectional view showing the structure of FIG. 31 is provided with dielectric layers in accordance with the third embodiment of the present invention.

FIG. 32 is a cross-sectional view of the structure with a third dielectric layer 231 laminated/coated on the dielectric base 13 and the first conductive traces 215 from below, and a fourth dielectric layer 241 laminated/coated on the second dielectric layer 221 and the second conductive traces 225 from above. The third dielectric layer 231 contacts and covers and extends laterally on the dielectric base 13 and the first conductive traces 215 from below. The fourth dielectric layer 241 contacts and covers and extends laterally on the second dielectric layer 221 and the second conductive traces 225 from above.

Figure 33:
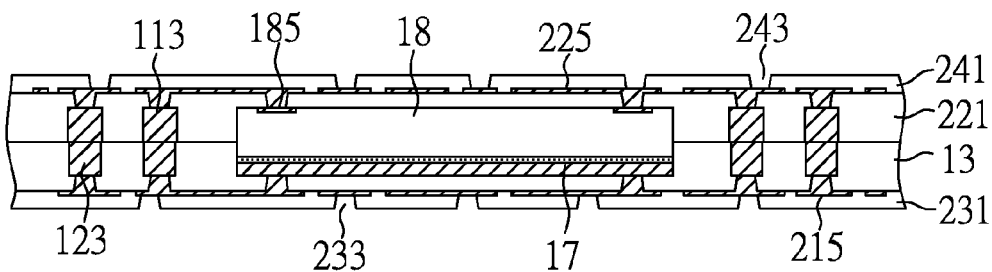
FIG. 33 is a cross-sectional view showing the structure of FIG. 32 is provided with via openings in accordance with the third embodiment of the present invention.

FIG. 33 is a cross-sectional view of the structure provided with third and fourth via openings 233, 243. The third via openings 233 extend through the third dielectric layer 231 to expose selected portions of the first conductive traces 215 in the downward direction. The fourth via openings 243 extend through the fourth dielectric layer 241 to expose selected portions of the second conductive traces 225 in the upward direction.

Figure 34:
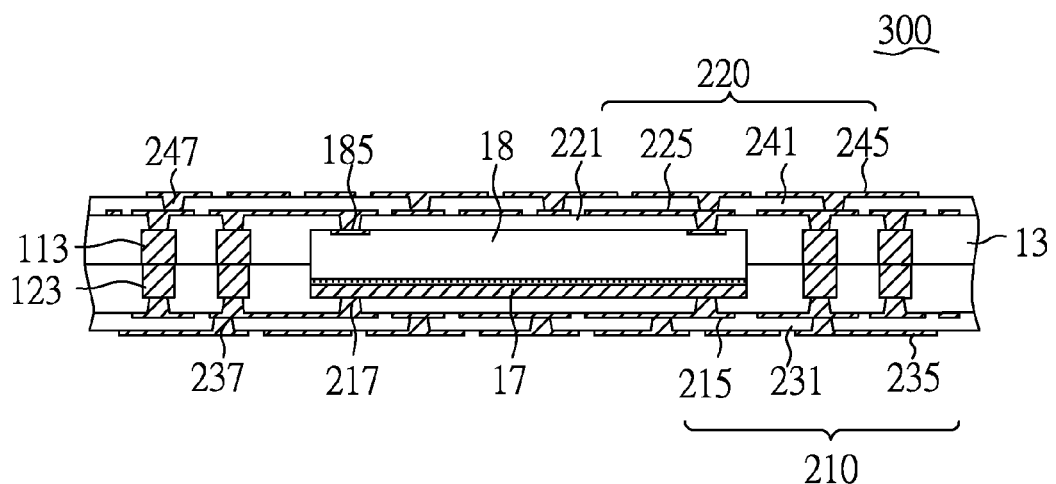
FIG. 34 is a cross-sectional view showing the structure of FIG. 33 is provided with conductive traces to finish the fabrication of a wiring board in accordance with the third embodiment of the present invention.

FIG. 34 is a cross-sectional view of the structure provided with third and fourth conductive traces 235, 245 on the third dielectric layer 231 and the fourth dielectric layer 241 by metal deposition and metal patterning process, respectively. The third conductive traces 235 extend from the first conductive traces 215 in the downward direction, fill up the third via openings 233 to form third conductive vias 237 in direct contact with the first conductive traces 215, and extend laterally on the third dielectric layer 231. The fourth conductive traces 245 extend from the second conductive traces 225 in the upward direction, fill up the fourth via openings 243 to form fourth conductive vias 247 in direct contact with the second conductive traces 225, and extend laterally on the fourth dielectric layer 241.

Accordingly, as shown in FIG. 34, a wiring board 300 is accomplished and includes metal posts 113, auxiliary metal pads 123, a dielectric base 13, a metal layer 17, an electronic component 18, a first buildup circuitry 210 and a second buildup circuitry 220. In this illustration, the first buildup circuitry 210 includes first conductive traces 215, a third dielectric layer 231 and third conductive traces 235, whereas the second buildup circuitry 220 includes a second dielectric layer 221, second conductive traces 225, a fourth dielectric layer 241 and fourth conductive traces 245.

The electronic component 18 is face-up disposed in the recess 130 of the dielectric base 13 and thermally conductible to the metal layer 17. The protrusion height of the electronic component 18 out from the recess 130 is substantially equal to the thickness of the metal posts 113, whereas the depth of the recess 130 is substantially equal to the thickness of the auxiliary metal pads 123. The first buildup circuitry 210 is electrically coupled to the auxiliary metal pads 123 and thermally conductible to the metal layer 17 through first conductive vias 217 in direct contact with the auxiliary metal pads 123 and the metal layer 17. The second buildup circuitry 220 is electrically coupled to the metal posts 113 and the contact pads 185 of the electronic component 18. The combination of the metal posts 113 and the auxiliary metal pads 123 can provide vertical electrical connections between the first and second buildup circuitries 210, 220.

Embodiment 4

FIGS. 35-40 are schematic views showing a method of making a wiring board with a metal shield around the electronic component and a metal lid over the electronic component in accordance with the fourth embodiment of the present invention.

For purposes of brevity, any description in aforementioned Embodiments above is incorporated herein insofar as the same is applicable, and the same description need not be repeated.

Figure 35:
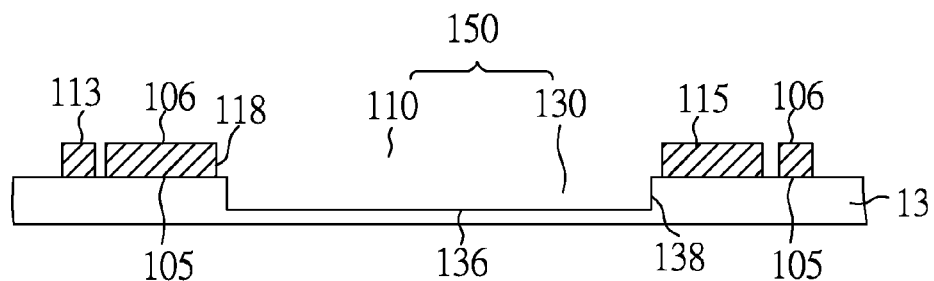
FIG. 35 is a cross-sectional view showing a metal shield and metal posts are formed on a dielectric base in accordance with the fourth embodiment of the present invention.

FIG. 35 is a cross-sectional view of the structure with an array of metal posts 113 and a metal shield 115 on a dielectric base 13. This structure can be fabricated by removing selected portions of the metal carrier 11 and the protruded metal platform 121 illustrated in FIG. 3. As a result, a placement area 150 is formed and consists of an aperture 110 and a recess 130. In this illustration, the aperture 110 is centrally aligned with the recess 130 and has a larger diameter than the recess 130. Alternatively, the diameter of the aperture 110 may be the same as that of the recess 130, and thus the sidewalls 118 of the aperture 110 is flush with the sidewalls 138 of the recess 130. The metal shield 115 laterally surrounds the aperture 110 and is spaced from and substantially coplanar with the metal posts 113 at first and second surfaces 105, 106.

Figure 36:
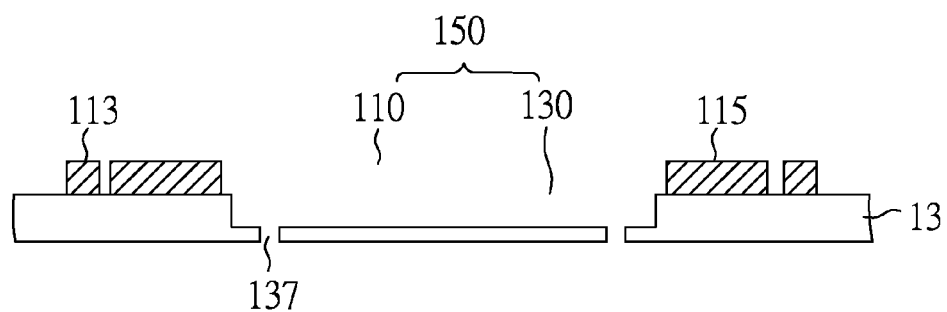
FIG. 36 is a cross-sectional view showing the structure of FIG. 35 is provided with through vias in accordance with the fourth embodiment of the present invention.

FIG. 36 is a cross-sectional view of the structure provided with through vias 137 in the dielectric base 13. The through vias 137 are aligned with the recess 130 and extend through the dielectric base 13.

Figure 37:
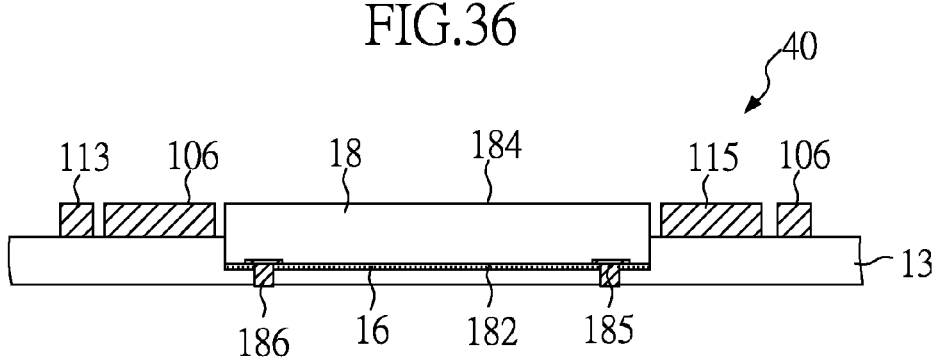
FIG. 37 is a cross-sectional view showing the structure of FIG. 36 is provided with an electronic component to finish the fabrication of a component-in-recess subassembly in accordance with the fourth embodiment of the present invention.

FIG. 37 is a cross-sectional view of the structure with an electronic component 18 placed in the placement area 150. In this embodiment, the electronic component 18 is illustrated as a bare chip and has contact pads 185 at its first surface 182 and bumps 186 on the contact pads 185. The bumps 186 can be copper, solder or gold pillars or other conductive bumps. The electronic component 18 is attached to the floor 136 of the recess 130 by an adhesive 16, with the bumps 186 being inserted into and exposed from the through vias 137 and the second surface 184 of the electronic component 18 being substantially coplanar with the second surfaces 106 of the metal posts 113 and the metal shield 115 in the upward direction.

At this stage, a component-in-recess subassembly 40 is accomplished and includes metal posts 113, a metal shield 115, a dielectric base 13 and an electronic component 18. As an example, the component-in-recess subassembly 40 can be used to fabricate a wiring board with dual buildup circuitries as follows.

Figure 38:
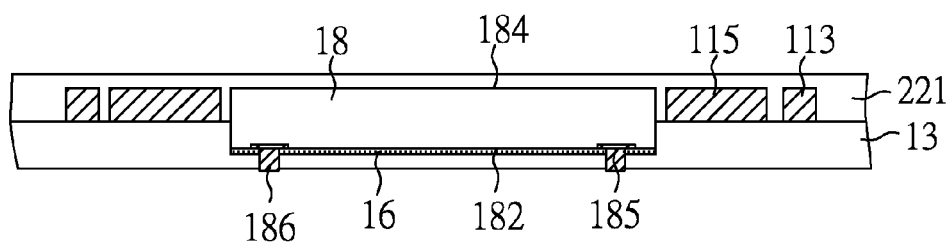
FIG. 38 is a cross-sectional view showing the structure of FIG. 37 is provided with a dielectric layer in accordance with the fourth embodiment of the present invention.

FIG. 38 is a cross-sectional view of the structure with a second dielectric layer 221 laminated/coated on the dielectric base 13, the metal posts 113, the metal shield 115 and the electronic component 18 from above. The second dielectric layer 221 contacts and covers the dielectric base 13, the metal posts 113, the metal shield 115 and the electronic component 18 from above, and surrounds and conformally coats sidewalls of the metal posts 113 and the metal shield 115, and fills a gap between the electronic component 18 and the metal shield 115 within the aperture 110.

Figure 39:
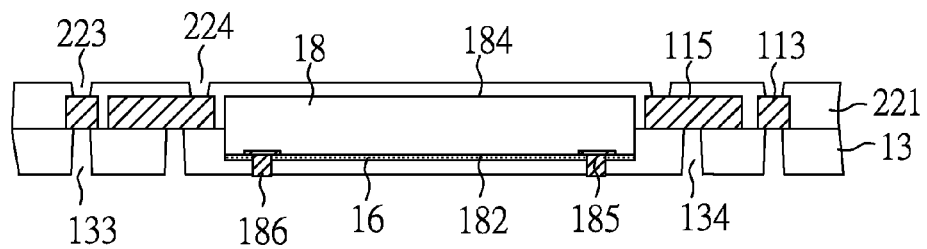
FIG. 39 is a cross-sectional view showing the structure of FIG. 38 is provided with via openings in accordance with the fourth embodiment of the present invention.

FIG. 39 is a cross-sectional view of the structure provided with first via openings 133, 134 and second via openings 223, 224. The first via openings 133, 134 extend through the dielectric base 13 and are aligned with and expose the metal posts 113 and the metal shield 115 in the downward direction, respectively. The second via openings 223, 224 extend through the second dielectric layer 221 and are aligned with and expose selected portions of the metal posts 113 and the metal shield 115 in the upward direction, respectively.

Figure 40:
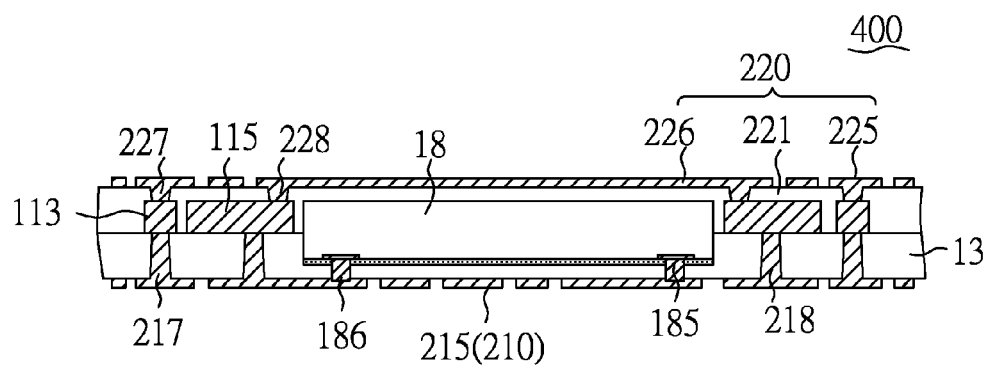
FIG. 40 is a cross-sectional view showing the structure of FIG. 39 is provided with conductive traces to finish the fabrication of a wiring board in accordance with the fourth embodiment of the present invention.

Referring now to FIG. 40, first conductive traces 215 and second conductive traces 225 as well as a metal lid 226 are respectively formed on the dielectric base 13 and the second dielectric layer 221 by metal deposition and metal patterning process. The first conductive traces 215 extend from the bumps 186 of the electronic component 18, the metal posts 113 and the metal shield 115 in the downward direction, fill up the first via openings 133, 134 to form first conductive vias 217, 218 in direct contact with the metal posts 113 and the metal shield 115, respectively, and extend laterally on the dielectric base 13. The second conductive traces 225 extend from the metal posts 113 in the upward direction, fill up the second via openings 223 to form second conductive vias 227 in direct contact with the metal posts 113, and extend laterally on the second dielectric layer 221. The metal lid 226 extends from the metal shield 115 in the upward direction, extends laterally on the second dielectric layer 221 to fill up the second via openings 224, and is therefore electrically connected to the metal shield 115 through additional second conductive vias 228.

Accordingly, as shown in FIG. 40, a wiring board 400 is accomplished and includes a dielectric base 13, metal posts 113, a metal shield 115, an electronic component 18, a first buildup circuitry 210 and a second buildup circuitry 220. In this illustration, the first buildup circuitry 210 includes first conductive traces 215, whereas the second buildup circuitry 220 includes a second dielectric layer 221, second conductive traces 225 and a metal lid 226.

The electronic component 18 is face-down disposed in the recess 130 of the dielectric base 13, with the side walls 138 of the recess 130 in close proximity to peripheral edges of the electronic component 18 and the bumps 186 of the electronic component 18 inserted into the through vias 137. The metal shield 115 laterally encloses and covers the electronic component 18 in the lateral directions and is electrically connected to the first conductive traces 215 of the first buildup circuitry 210 and the metal lid 226 of the second buildup circuitry 220. The metal lid 226 laterally extends beyond the peripheral edges of the electronic component 18 to completely cover the electronic component 18 in the upward direction. Further, the first and second buildup circuitries 210, 220 are electrically connected to each other by the first conductive vias 217, 218, the second conductive vias 227, 228, the metal posts 113 and the metal shield 115. As a result, the metal posts 113 can provide the wiring board 400 with stacking capacity, and the metal shield 115 and the metal lid 226 can be electrically connected to ground contact pads of the electronic component 18 through the first conductive traces 215, thereby providing horizontal and vertical EMI shielding effect for the electronic component 18.

Figure 41:
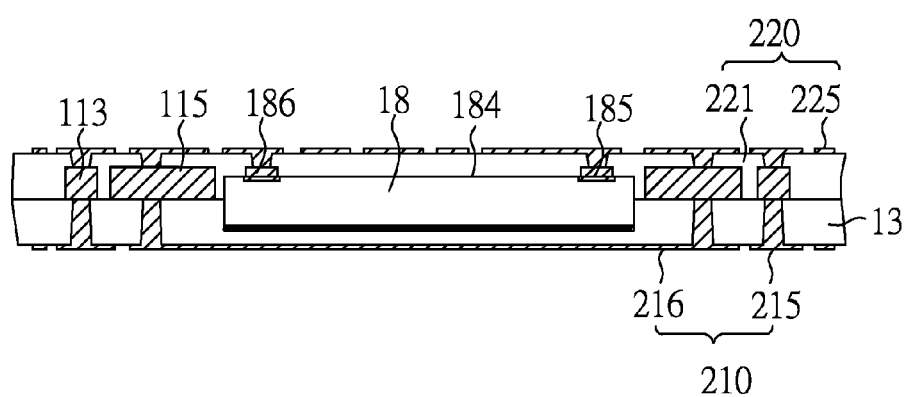
FIG. 41 is a cross-sectional view of another aspect of wiring board in accordance with the fourth embodiment of the present invention.

FIG. 41 is a cross-sectional view of another aspect of wiring bard that is similar to that of FIG. 40, except that the electronic component 18 is face-up disposed in the recess 130, the first buildup circuitry 210 includes first conductive traces 215 electrically coupled to the metal posts 113 and a metal lid 216 electrically coupled to the metal shield 115, and the second buildup circuitry 220 includes second conductive traces 225 electrically coupled to the bumps 186, the metal posts 113 and the metal shield 115 in this aspect. In this illustration, the bumps 186 are substantially coplanar with the metal posts 113 and the metal shield 115 at their tops.

Embodiment 5

FIGS. 42-50 are schematic views showing a method of making a wiring board with plated through holes extending through the stiffener as vertical connections in accordance with the fifth embodiment of the present invention.

For purposes of brevity, any description in aforementioned Embodiments above is incorporated herein insofar as the same is applicable, and the same description need not be repeated.

Figure 42:
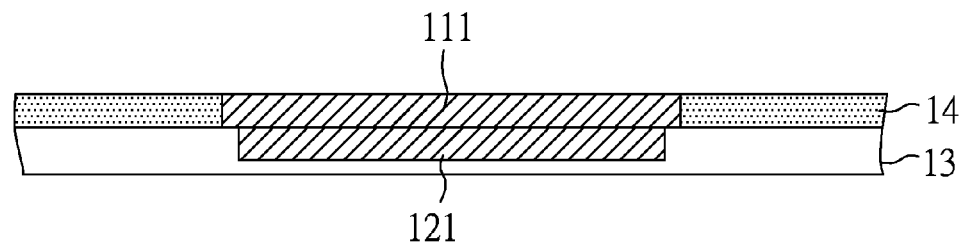
FIG. 42 is a cross-sectional view showing a stiffener is formed on a dielectric base and around a metal slug in accordance with the fifth embodiment of the present invention.

FIG. 42 is a cross-sectional view of the structure with a stiffener 14 on a dielectric base 13 and around a metal slug 111. The structure is similar to that illustrated in FIG. 6, except that no metal posts are formed and the metal slug 111 laterally extends beyond peripheral edges of the protruded metal platform 121 in this embodiment.

Figure 43:
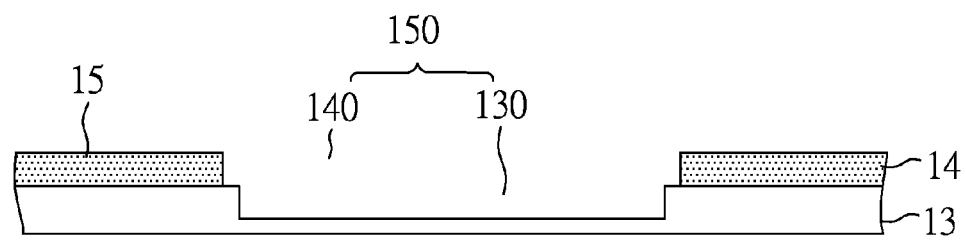
FIG. 43 is a cross-sectional view showing the structure of FIG. 42 is provided with a recess in accordance with the fifth embodiment of the present invention.

FIG. 43 is a cross-sectional view of the structure with a placement area 150 formed by removing the metal slug 111 and the protruded metal platform 121. The placement area 150 consists of a recess 130 and an aperture 140. The aperture 140 extends through the stiffener 14 and is centrally aligned with the recess 130 that extends into the dielectric base 13 and has a smaller diameter than the aperture 140.

Figure 44:
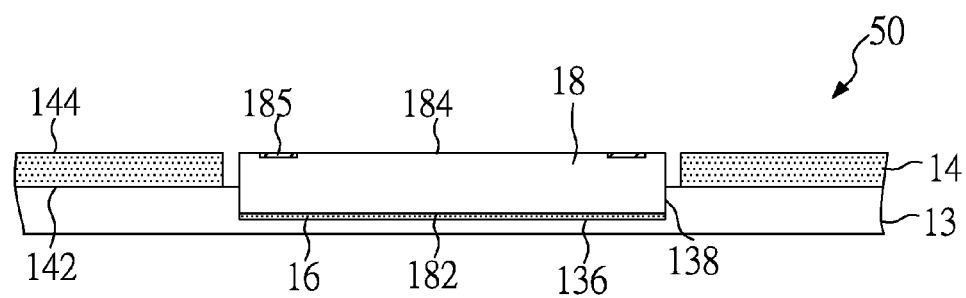
FIG. 44 is a cross-sectional view showing the structure of FIG. 43 is provided with an electronic component to finish the fabrication of a component-in-recess subassembly in accordance with the fifth embodiment of the present invention.

FIG. 44 is a cross-sectional view of the structure with an electronic component 18 placed in the placement area 150. In this embodiment, the electronic component 18 is illustrated as a bare chip and attached to the floor 136 of the recess 130 by adhesive 16 in direct contact with the first surface 182 of the electronic component 18 and the floor 136. The electronic component 18 has contact pads 185 at the second surface 184 and is confined at the predetermined location by the side walls 138 of the recess 130 in close proximity to peripheral edges of the electronic component 18. The second surface 184 of the electronic component 18 is substantially coplanar with the second surface 144 of the stiffener 14 in the upward direction.

At this stage, a component-in-recess subassembly 50 is accomplished and includes a dielectric base 13, a stiffener 14 and an electronic component 18. As an example, the component-in-recess subassembly 50 can be used to fabricate a wiring board with dual buildup circuitries as follows.

Figure 45:
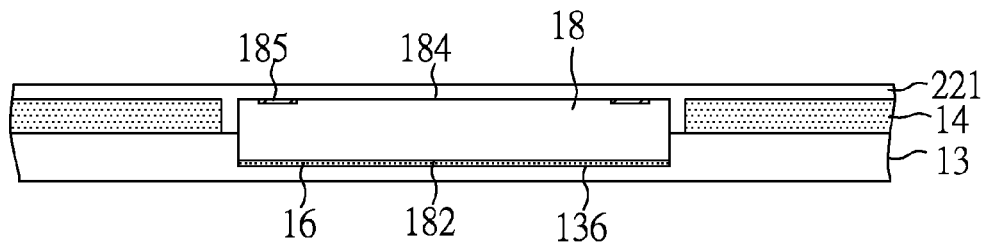
FIG. 45 is a cross-sectional view showing the structure of FIG. 44 is provided with a dielectric layer in accordance with the fifth embodiment of the present invention.

FIG. 45 is a cross-sectional view of the structure with a second dielectric layer 221 laminated/coated on the stiffener 14 and the electronic component 18 from above. The second dielectric layer 221 contacts and covers the stiffener 14 and the electronic component 18 from above, and further fills a gap between the electronic component 18 and the stiffener 14 within the aperture 140.

Figure 46:
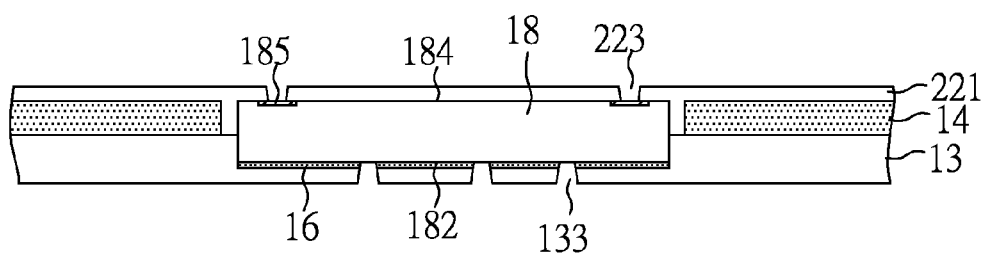
FIG. 46 is a cross-sectional view showing the structure of FIG. 45 is provided with via openings in accordance with the fifth embodiment of the present invention.

FIG. 46 is a cross-sectional view of the structure provided with first via openings 133 and second via openings 223. The first via openings 133 extend through the dielectric base 13 and the adhesive 16 and are aligned with and expose selected portions of the first surface 182 of the electronic component 18 in the downward direction. The second via openings 223 extend through the second dielectric layer 221 and are aligned with and expose the contact pads 185 of the electronic component 18 in the upward direction.

Figure 47:
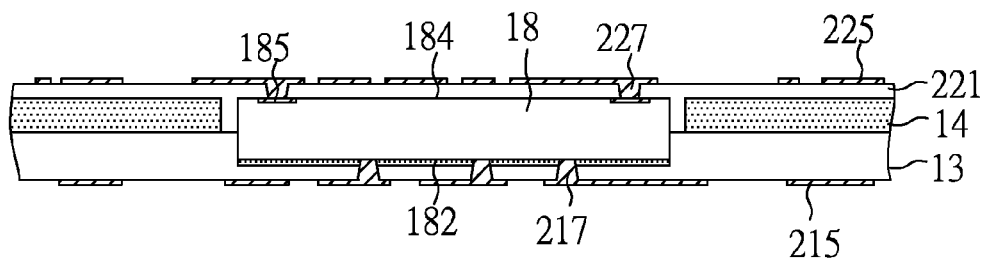
FIG. 47 is a cross-sectional view showing the structure of FIG. 46 is provided with conductive traces in accordance with the fifth embodiment of the present invention.

Referring now to FIG. 47, first conductive traces 215 and second conductive traces 225 are respectively formed on the dielectric base 13 and the second dielectric layer 221 by metal deposition and metal patterning process. The first conductive traces 215 extend from the first surface 182 of the electronic component 18 in the downward direction, fill up the first via openings 133 to form first conductive vias 217, and extend laterally on the dielectric base 13. The second conductive traces 225 extend from the contact pads 185 of the electronic component 18 in the upward direction, fill up the second via openings 223 to form second conductive vias 227, and extend laterally on the second dielectric layer 221.

Figure 48:
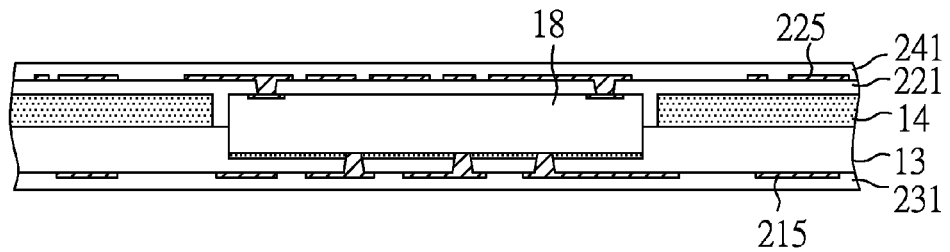
FIG. 48 is a cross-sectional view showing the structure of FIG. 47 is provided with dielectric layers in accordance with the fifth embodiment of the present invention.

FIG. 48 is a cross-sectional view of the structure with a third dielectric layer 231 laminated/coated on the dielectric base 13 and the first conductive traces 215 from below, and a fourth dielectric layer 241 laminated/coated on the second dielectric layer 221 and the second conductive traces 225 from above. The third dielectric layer 231 contacts and covers and extends laterally on the dielectric base 13 and the first conductive traces 215 from below. The fourth dielectric layer 241 contacts and covers and extends laterally on the second dielectric layer 221 and the second conductive traces 225 from above.

Figure 49:
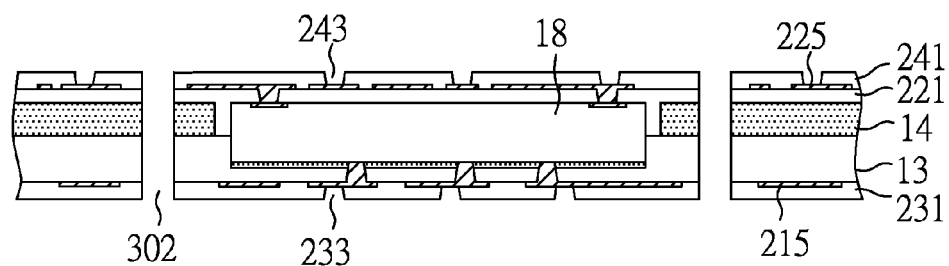
FIG. 49 is a cross-sectional view showing the structure of FIG. 48 is provided with via openings and through holes in accordance with the fifth embodiment of the present invention.

FIG. 49 is a cross-sectional view of the structure provided with third and fourth via openings 233, 243 and through holes 302. The third via openings 233 extend through the third dielectric layer 231 to expose selected portions of the first conductive traces 215 in the downward direction. The fourth via openings 243 extend through the fourth dielectric layer 241 to expose selected portions of the second conductive traces 225 in the upward direction. The through holes 302 extend through the dielectric base 13, the stiffener 14, the second dielectric layer 221, the third dielectric layer 231 and the fourth dielectric layer 241 in the vertical direction. The through holes 302 are formed by mechanical drilling and can be formed by other techniques such as laser drilling and plasma etching with or without wet etching.

Figure 50:
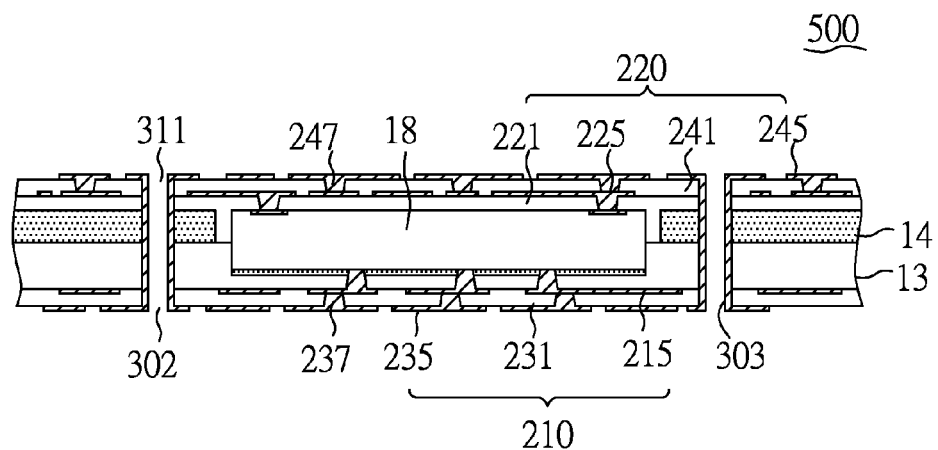
FIG. 50 is a cross-sectional view showing the structure of FIG. 49 is provided with conductive traces and plated through holes to finish the fabrication of a wiring board in accordance with the fifth embodiment of the present invention.

Referring now to FIG. 50, third conductive traces 235 and fourth conductive traces 245 are respectively formed on the third dielectric layer 231 and the fourth dielectric layer 241 by metal deposition and metal patterning process, respectively. The third conductive traces 235 extend from the first conductive traces 215 in the downward direction, fill up the third via openings 233 to form third conductive vias 237, and extend laterally on the third dielectric layer 231. The fourth conductive traces 245 extend from the second conductive traces 225 in the upward direction, fill up the fourth via openings 243 to form fourth conductive vias 247, and extend laterally on the fourth dielectric layer 241.

Also shown in FIG. 50 is a connecting layer 303 deposited in the through holes 302 to provide the plated through holes 311. The connecting layer 303 is a hollow tube that covers the inner sidewall of the through holes 302 and extends vertically to electrically connect the third conductive traces 235 and the fourth conductive traces 245.

Accordingly, as shown in FIG. 50, a wiring board 500 is accomplished and includes a dielectric base 13, a stiffener 14, an electronic component 18, a first buildup circuitry 210, a second buildup circuitry 220 and plated through holes 311. In this illustration, the first buildup circuitry 210 includes first conductive traces 215, a third dielectric layer 231 and third conductive traces 235, whereas the second buildup circuitry 220 includes a second dielectric layer 221, second conductive traces 225, a fourth dielectric layer 241 and fourth conductive traces 245. The first buildup circuitry 210 is thermally conductible to the face-up disposed electronic component 18 through the first conductive vias 217, and is electrically connected to the second buildup circuitry 220 by the plated through holes 311. The plated through holes 311 are essentially shared by the dielectric base 13, the stiffener 14, the first buildup circuitry 210 and the second buildup circuitry 220, and provide electrical and thermal connections between the first buildup circuitry 210 and the second buildup circuitry 220.

Embodiment 6

FIGS. 51-58 are schematic views showing a method of making a wiring board with plated through holes extending through a metal shield in accordance with the sixth embodiment of the present invention.

For purposes of brevity, any description in aforementioned Embodiments above is incorporated herein insofar as the same is applicable, and the same description need not be repeated.

Figure 51:
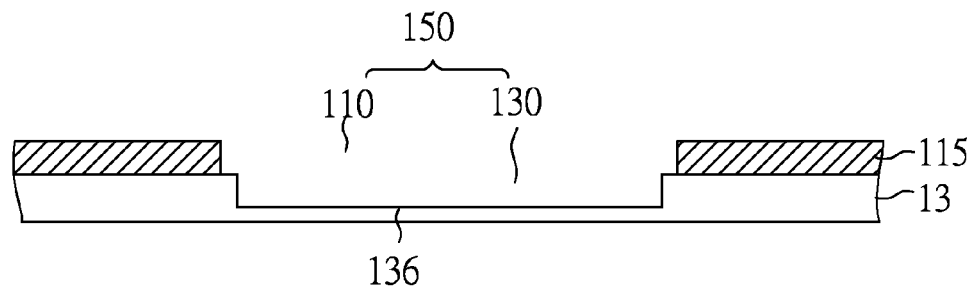
FIG. 51 is a cross-sectional view showing a metal shield is formed on a dielectric base in accordance with the sixth embodiment of the present invention.

FIG. 51 is a cross-sectional view of the structure with a metal shield 115 on a dielectric base 13. This structure can be fabricated by removing the protruded metal platform 121 and a corresponding portion of the metal carrier 11 illustrated in FIG. 3. As a result, a placement area 150 is formed and consists of aperture 110 and a recess 130. In this illustration, the aperture 110 is centrally aligned with the recess 130 and has a larger diameter than the recess 130. The metal shield 115 surrounds the aperture 110 and laterally extends to peripheral edges of the structure.

Figure 52:
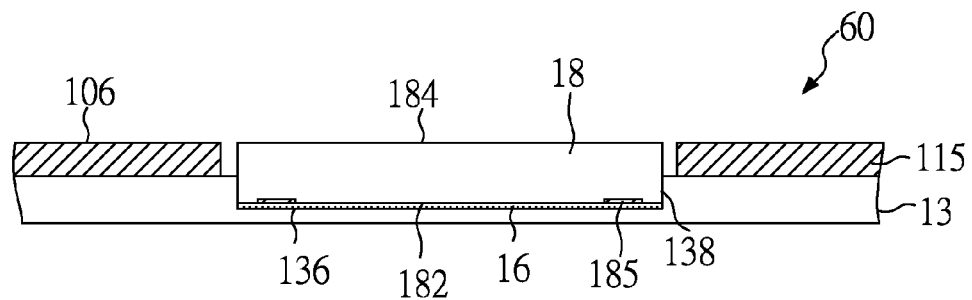
FIG. 52 is a cross-sectional view showing the structure of FIG. 51 is provided with an electronic component to finish the fabrication of a component-in-recess subassembly in accordance with the sixth embodiment of the present invention.

FIG. 52 is a cross-sectional view of the structure with an electronic component 18 placed in the placement area 150. In this embodiment, the electronic component 18 is illustrated as a bare chip and has contact pads 185 at its first surface 182. The electronic component 18 is attached to the floor 136 of the recess 130 by an adhesive 16, with the second surface 184 of the electronic component 18 being substantially coplanar with the second surface 106 of the metal shield 115 in the upward direction.

At this stage, a component-in-recess subassembly 60 is accomplished and includes a dielectric base 13, a metal shield 115 and an electronic component 18. As an example, the component-in-recess subassembly 60 can be used to fabricate a wiring board with dual buildup circuitries as follows.

Figure 53:
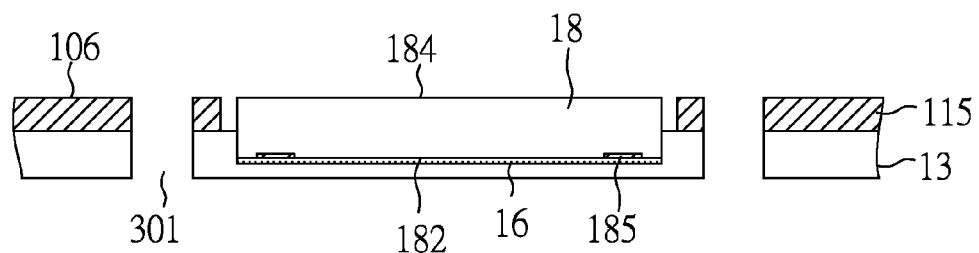
FIG. 53 is a cross-sectional view showing the structure of FIG. 52 is provided with though openings in accordance with the sixth embodiment of the present invention.

FIG. 53 is a cross-sectional view of the structure provided with through openings 301. The through openings 301 extend through the dielectric base 13 and the metal shield 115 in the vertical direction and can be formed by mechanical drilling.

Figure 54:
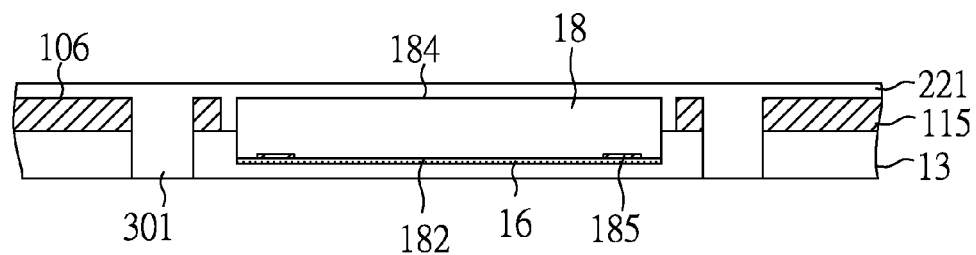
FIG. 54 is a cross-sectional view showing the structure of FIG. 53 is provided with a dielectric layer in accordance with the sixth embodiment of the present invention.

FIG. 54 is a cross-sectional view of the structure with a second dielectric layer 221 laminated/coated on the metal shield 115 and the electronic component 18 from above. The second dielectric layer 221 contacts and covers the second surface 106 of the metal shield 115 and the second surface 184 of the electronic component 18 from above, and further fills the through openings 301 and a gap between the electronic component 18 and the metal shield 115 within the aperture 110.

Figure 55:
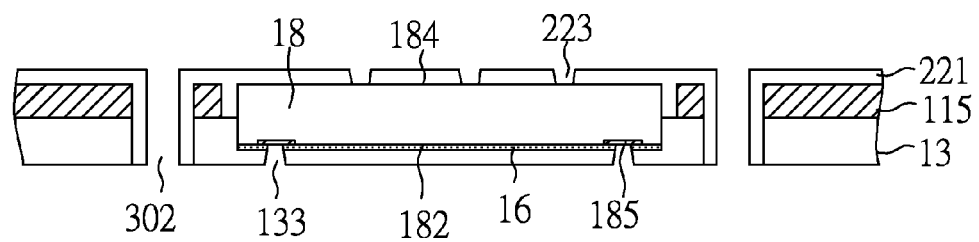
FIG. 55 is a cross-sectional view showing the structure of FIG. 54 is provided with via openings and through holes in accordance with the sixth embodiment of the present invention.

FIG. 55 is a cross-sectional view of the structure provided with first and second via openings 133, 223 and through holes 302. The first via openings 133 extend through the dielectric base 13 and the adhesive 16 to expose the contact pads 185 of the electronic component 18 in the downward direction. The second via openings 223 extend through the second dielectric layer 221 to expose selected portions of the second surface 184 of the electronic component 18 in the upward direction. The through holes 302 are aligned with the through openings 301 and extend though the metal shield 115, the dielectric base 13 and the second dielectric layer 221 in vertical directions.

Figure 56:
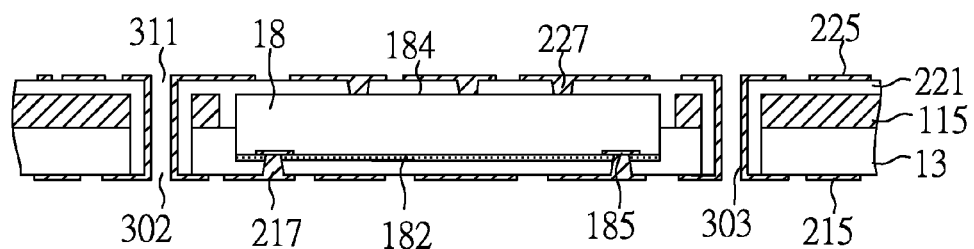
FIG. 56 is a cross-sectional view showing the structure of FIG. 55 is provided with conductive traces and plated through holes in accordance with the sixth embodiment of the present invention.

Referring now to FIG. 56, first and second conductive traces 215, 225 are respectively formed on the dielectric base 13 and second dielectric layer 221 by metal deposition and metal patterning process, respectively. The first conductive traces 215 extend from the contact pads 185 of the electronic component 18 in the downward direction, fill up the first via openings 133 to form first conductive vias 217, and extend laterally on the dielectric base 13. The second conductive traces 225 extend from the second surface 184 of the electronic component 18 in the upward direction, fill up the second via openings 223 to form second conductive vias 227, and extend laterally on the second dielectric layer 221.

Also shown in FIG. 56 is a connecting layer 303 deposited in the through holes 302 to provide the plated through holes 311. The connecting layer 303 extends vertically to electrically connect the first conductive traces 215 and the second conductive traces 225.

Figure 57:
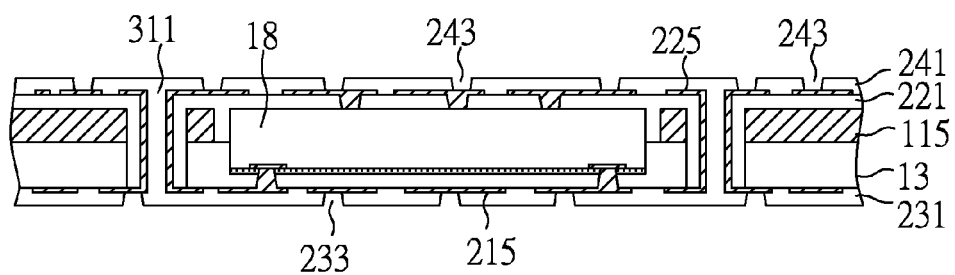
FIG. 57 is a cross-sectional view showing the structure of FIG. 56 is provided with dielectric layers and via openings in accordance with the sixth embodiment of the present invention.

FIG. 57 is a cross-sectional view of the structure provided with third and fourth dielectric layers 231, 241 and third and fourth via openings 233, 243. The third dielectric layers 231 is laminated/coated on the dielectric base 13 and the first conductive traces 215 from below, whereas the fourth dielectric layer 241 is laminated/coated on the second dielectric layer 221 and the second conductive traces 225 from above. Further, the third dielectric layer 231 and the fourth dielectric layer 241 also fill the remaining space of the through holes 302. The third via openings 233 extend through the third dielectric layer 231 to expose selected portions of the first conductive traces 215 in the downward direction. The fourth via openings 243 extend through the fourth dielectric layer 241 to expose selected portions of the second conductive traces 225 in the upward direction.

Figure 58:
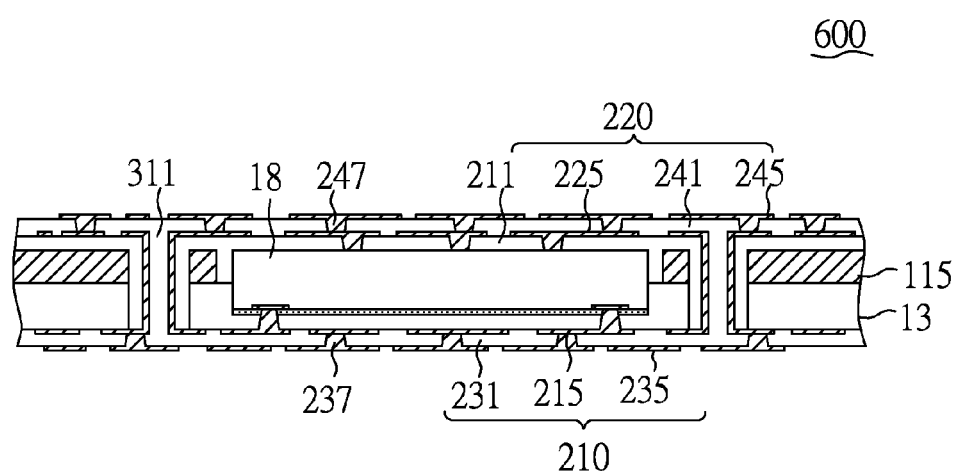
FIG. 58 is a cross-sectional view showing the structure of FIG. 57 is provided with conductive traces to finish the fabrication of a wiring board in accordance with the sixth embodiment of the present invention.

FIG. 58 is a cross-sectional view of the structure provided with third conductive traces 235 and fourth conductive traces 245 respectively on the third dielectric layer 231 and the fourth dielectric layer 241 by metal deposition and metal patterning process. The third conductive traces 235 extend from the first conductive traces 215 in the downward direction, fill up the third via openings 233 to form third conductive vias 237, and extend laterally on the third dielectric layer 231. The fourth conductive traces 245 extend from the second conductive traces 225 in the upward direction, fill up the fourth via openings 243 to form fourth conductive vias 247, and extend laterally on the fourth dielectric layer 241.

Accordingly, as shown in FIG. 58, a wiring board 600 is accomplished and includes a metal shield 115, a dielectric base 13, an electronic component 18, a first buildup circuitry 210, a second buildup circuitry 220 and plated through holes 311. In this illustration, the first buildup circuitry 210 includes first conductive traces 215, a third dielectric layer 231 and third conductive traces 235, whereas the second buildup circuitry 220 includes a second dielectric layer 221, second conductive traces 225, a fourth dielectric layer 241 and fourth conductive traces 245. The plated through holes 311 are electrically coupled to the first and second conductive traces 215, 225 to provide the wiring board 600 with stacking capacity.

The component-in-recess subassemblies and stackable wiring boards described above are merely exemplary. Numerous other embodiments are contemplated. In addition, the embodiments described above can be mixed-and-matched with one another and with other embodiments depending on design and reliability considerations. For instance, the dielectric base may include multiple recesses arranged in an array and each recess accommodates an electronic component therein. Also, the first and second buildup circuitries can include additional conductive traces to receive and route additional contact pads or bumps of additional electronic components.

As illustrated in the aforementioned embodiments, a distinctive component-in-recess subassembly is configured and includes a dielectric base, a recess, an array of metal posts and an electronic component, wherein (i) the dielectric base has substantially parallel first and second surfaces in opposite first and second directions, respectively; (ii) the recess extends into the dielectric base from the second surface of the dielectric base and has a floor and sidewalls, the sidewalls extending from the floor to the second surface of the dielectric base; (iii) the metal posts are disposed over the second surface of the dielectric base and spaced form the recess, the metal posts each having a first surface adjacent to the dielectric base and an opposite second surface apart from the dielectric base; and (iv) the electronic component is disposed in the recess and protrudes out from the recess and preferably has a surface substantially coplanar with the second surface of the metal posts in the second direction, with the sidewalls of the recess confining the dislocation of the electronic component.

Further, the component-in-recess subassembly can be used to fabricate a stackable wiring board with metal posts as vertical connections, which includes the aforementioned component-in-recess subassembly, a first buildup circuitry over the first surface of the dielectric base from the first direction, and a second buildup circuitry over the electronic component and the metal posts from the second direction, wherein one of the first and second buildup circuitries is electrically coupled to the electronic component, and the first buildup circuitry is electrically connected to the second buildup circuitry through conductive vias in the dielectric base.

Additionally, it is also feasible to fabricate another aspect of stackable wiring board with plated through holes as vertical connections, which includes a dielectric base, a recess, an electronic component, a first buildup circuitry, a second buildup circuitry and plated through holes, wherein (i) the dielectric has substantially parallel first and second surfaces in opposite first and second directions, respectively; (ii) the recess extends into the dielectric base from the second surface of the dielectric base and has a floor and sidewalls, the sidewalls extending from the floor to the second surface of the dielectric base; (iii) the electronic component is disposed in the recess and protrudes out from the recess, with the sidewalls of the recess confining the dislocation of the electronic component; (iv) the first buildup circuitry is disposed over the first surface of the dielectric base from the first direction; (v) the second buildup circuitry is disposed over the electronic component from the second direction, and one of the first and second buildup circuitries is electrically coupled to the electronic component; and (vi) the plated through holes provide electrical connections between the first buildup circuitry and the second buildup circuitry.

Optionally, the component-in-recess subassembly and the stackable wiring board may further include a metal shield, a stiffener, a metal layer or/and an array of auxiliary metal pads, wherein (i) the metal shield is formed on the second surface of dielectric base and can be substantially coplanar with the metal posts at first and second surfaces that face in the first and second directions, respectively; (ii) the stiffener covers the second surface of the dielectric base and sidewalls of the metal posts and the optional metal shield; (iii) the metal layer is formed on the floor of the recess and disposed between the electronic component and the dielectric base; (iv) the auxiliary metal pads contact and cover the first surface of the metal posts and have sidewalls surrounded and covered by the dielectric base.

The electronic component can include contact pads at one surface thereof for electrical connections and may further include bumps on its contact pads. For instance, the contact pads of the electronic component may be located at its second surface that faces in the second direction, and thus the electronic component is face-down disposed in the recess. Alternatively, the contact pads of the electronic component are located at its first surface that faces in the first direction, and thus the electronic component is face-down disposed in the recess. The electronic component can be attached to the floor of the recess or to the metal layer in the recess by an adhesive and protrudes out from the recess. The adhesive contacts and is sandwiched between the floor/metal layer and the first surface of the electronic component to provide mechanical bonds between the electronic component and the dielectric base/metal layer. In a preferred embodiment, the protrusion height of the electronic component out from the recess is substantially equal to the thickness of the metal posts, the optional metal shield and the optional stiffener. Additionally, the placement accuracy of the electronic component is provided by the sidewalls of the recess that are laterally aligned with and in close proximity to the peripheral edges of the electronic component. As the sidewalls of the recess extend from the floor and extend beyond the first surface of the electronic component in the second direction, the sidewalls of the recess can confine the dislocation of the electronic component laterally. The electronic component may be a semiconductor device, such as a packaged or unpackaged chip. For instance, the electronic component can be a bare chip, or a wafer level packaged die, etc. Alternatively, the electronic component can be a stacked-die chip.

The metal posts and the optional metal shield can be formed by removing a selected portion of a metal carrier with a protruded metal platform thereon and have the same thickness. The metal posts can contact and be disposed on the second surface of the dielectric base or the auxiliary metal pads and provide vertical electrical connections between the first and second buildup circuitries. The metal shield can be disposed on the second surface of the dielectric base around the entrance of the recess and laterally surround the electronic component and provide horizontal electromagnetic shielding for the electronic component.

The stiffener can have an aperture centrally aligned with the recess and preferably is substantially coplanar with the metal posts at first and second surfaces that face in the first and second directions, respectively. In a preferred embodiment, after removing a selected portion of the metal carrier to from metal posts and a metal slug that covers the protruded metal platform in the second direction, the stiffener is provided to cover sidewalls of the metal slug and the metal posts, followed by removing the metal slug and the protruded metal platform to form the aperture and the recess. The stiffener can laterally surround and cover sidewalls of the electronic component and the metal posts, and laterally extend to peripheral edges of the component-in-recess subassembly or the stackable wiring board. The stiffener can be made of any material which has enough mechanical robustness, and provide mechanical support for the stackable wiring board to suppress warping and bending. Further, the aperture diameter of the stiffener can essentially the same or slightly larger than the recess diameter of the dielectric base. As a result, the electronic component can be inserted through the aperture of the stiffener and into the recess of the dielectric base, and be retained at a predetermined location using the sidewalls of the recess as a dislocation controller.

The optional auxiliary metal pads and the protruded metal platform can be made of copper, aluminum, nickel or other metals or alloys and be simultaneously deposited on the first surface of the metal carrier. In a preferred embodiment, the dielectric base covers, contacts and conformally coats sidewalls and first surfaces of the optional auxiliary metal pads and the protruded metal platform and is substantially coplanar with the optional auxiliary metal pads and the protruded metal platform at their first surfaces facing in the first direction. As the auxiliary metal pads and the protruded metal platform can have the same thickness, the depth of the recess can be substantially equal to the thickness of the auxiliary metal pads. For the component-in-recess subassembly and the stackable wiring board having the auxiliary metal pads, the metal posts contact and cover the second surface of the auxiliary metal pads in the second direction, and the total thickness of the electronic component preferably is substantially equal to the combined thickness of the metal posts and the auxiliary metal pads. Further, the diameter of the metal post at its first surface may be the same as or different from that of the auxiliary metal pad at its second surface.

The first and second buildup circuitries are respectively disposed at both opposite sides of the electronic component, the metal posts, the dielectric base, the optional stiffener and the optional metal shield, and can provide fan-out routing/interconnection. The first buildup circuitry covers and contacts the first surface of the dielectric base in the first direction, whereas the second buildup circuitry covers and contacts the second surfaces of the electronic component and the metal posts in the second direction. The first buildup circuitry includes one or more first conductive traces, whereas the second buildup circuitry includes a second dielectric layer and one or more second conductive traces. For the stackable wiring board without the stiffener, the second buildup circuitry further contacts the dielectric base. For instance, the second dielectric layer covers and contacts the second surfaces of the electronic component, the metal posts, the dielectric base and the optional metal shield in the second direction, and laterally covers and conformally coats sidewalls of the metal posts, the electronic component and the optional metal shield. As for the stackable wiring board with the stiffener, the second buildup circuitry is spaced from the dielectric base by the stiffener. For instance, the second dielectric layer covers and contacts the second surfaces of the electronic component, the metal posts and the stiffener in the second direction. The first conductive traces extend laterally on the dielectric base and can be electrically coupled to the contact pads of the face-down disposed electronic component through first conductive vias that extend through the dielectric base and adhesive and are formed in direct contact with the contact pads. Alternatively, the first conductive traces contact and laterally extend on the bumps of the face-down disposed electronic component that are inserted into and exposed from through vias aligned with the recess and formed through the dielectric base. The second conductive traces extend laterally on the second dielectric layer and can be electrically coupled to the contact pads or the bumps of the face-up disposed electronic component through second conductive vias in direct contact with the contact pads or the bumps of the electronic component. Accordingly, the first or second conductive traces can directly contact the contact pads or the bumps to provide signal routing for the electronic component, and thus the electrical connection between the electronic component and the first or second buildup circuitry can be devoid of soldering material.

Additionally, in the aspect of the metal shield being formed for lateral EMI shielding, the first buildup circuitry may further include a metal lid that extends laterally on the dielectric base in the face-up aspect, or the second buildup circuitry further includes a metal lid that extends laterally on the second dielectric layer in the face-down aspect. The metal lid preferably is a continuous metal layer that is centrally aligned with the electronic component and laterally extends outward at least to peripheral edges of the electronic component. For instance, the metal lid can laterally extend to be coplanar with peripheral edges of the electronic component in the lateral directions, or laterally extend beyond peripheral edges of the electronic component outward. Accordingly, the metal lid that completely covers the electronic component from the first or second direction can minimize the vertical electromagnetic interference.

The first and second buildup circuitries can be electrically connected to each other by the metal posts. For instance, the first conductive traces can extend through first via openings in the dielectric base to form first conductive vias in direct contact with the first surface of the metal posts or the auxiliary metal pads for signal routing or power/ground connection. Likewise, the second conductive traces can extend through second via openings in the second dielectric layer to form second conductive vias in direct contact with the second surface of the metal posts for signal routing or power/ground connection. As a result, the metal posts can provide vertical electrical connections between the first and second buildup circuitries. As an alternative, one or more plated though holes may be provided for the vertical electrical connections between the first and second buildup circuitries. The plated though hole can be formed by simultaneously depositing a connecting layer on inner sidewalls of a through hole while forming outer or inner conductive layers of the first and second buildup circuitries. The through hole can be formed after depositing the second dielectric layer and the optional stiffener, and extend through the optional stiffener, the dielectric base, the second dielectric layer and optional one or more additional dielectric layers of the first and second buildup circuitries. As a result, the plated though hole at the first end can extend to and be electrically connected to outer or inner conductive traces or the metal lid of the first buildup circuitry, and at the second end can extend to and be electrically connected to outer or inner conductive traces or the metal lid of the second buildup circuitry.

In order to provide effective lateral EMI shielding, the metal shield can be electrically connected to at least one of the contact pads of the electronic component for grounding through the first buildup circuitry in the face-down aspect or through the second buildup circuitry in the face-up aspect to minimize the lateral electromagnetic interference. For instance, in the face-down aspect, the metal shield may be electrically connected to the first buildup circuitry through metal posts or plated through holes, or through an additional first conductive via in electrical contact with the first surface of the metal shield. As for the face-up aspect, the metal shield may be electrically connected to the second buildup circuitry through metal posts or plated through holes, or through an additional second conductive via in electrical contact with the second surface of the metal shield. Likewise, in order to provide effective vertical EMI shielding, the metal lid can be electrically connected to at least one of the contact pads of the electronic component for grounding through the first buildup circuitry in the face-down aspect or through the second buildup circuitry in the face-up aspect to minimize the vertical electromagnetic interference. For instance, in the face-down aspect, the metal lid of the second buildup circuitry can be electrically connected to the first buildup circuitry for ground connection through at least one of the metal posts or plated through holes and is electrically coupled to the first buildup circuitry. Alternatively, the metal lid of the second buildup circuitry is electrically connected to the metal shield through an additional second conductive via in electrical contact with the second surface of the metal shield and is further electrically connected to the first buildup circuitry through an additional first conductive via in electrical contact with the first surface of the metal shield. As for the face-up aspect, the metal lid of the first buildup circuitry can be electrically connected to the second buildup circuitry for ground connection through at least one of the metal posts or plated through holes and is electrically coupled to the second buildup circuitry. Alternatively, the metal lid of the first buildup circuitry is electrically connected to the metal shield through an additional first conductive via in electrical contact with the first surface of the metal shield and is further electrically connected to the second buildup circuitry through an additional second conductive via in electrical contact with the second surface of the metal shield.

In consideration of thermal dissipation, the first buildup circuitry may further be thermally conductible to the face-up disposed electronic component or to the metal layer through additional first conductive vias in direct contact with the first surface of the electronic component or the metal layer. Alternatively, the second buildup circuitry may further be thermally conductible to the face-down disposed electronic component through additional second conductive vias in direct contact with the second surface of the electronic component. As a result, the first or second conductive vias in direct contact with the electronic component can serve as heat pipes, and thus the heat generated from the electronic component can be dissipated to the outer conductive traces of the first or second buildup circuitry by the additional first or second conductive vias.

The first and second buildup circuitries can further include additional dielectric layers, additional via openings, and additional conductive traces if needed for further signal routing. The outmost conductive traces of the first and second buildup circuitries can respectively accommodate conductive joints, such as solder balls, for electrical communication and mechanical attachment with another electronic device.

The term "cover" refers to incomplete or complete coverage in a vertical and/or lateral direction. For instance, in the recess-up position, the dielectric base covers the electronic component in the downward direction regardless of whether another element such as the adhesive is between the dielectric base and the electronic component.

The phrase "corresponding portion of the metal carrier" refers to a selected portion of the metal carrier that covers the protruded metal platform in the second direction. For instance, in the recess-up position, the corresponding portion of the metal carrier completely covers the protruded metal platform in the upward direction regardless of whether the corresponding portion of the metal carrier laterally extends beyond peripheral edges of the protruded metal platform or laterally extends to be flush with peripheral edges of the protruded metal platform.

The phrase "aligned with" refers to relative position between elements regardless of whether elements are spaced from or adjacent to one another or one element is inserted into and extends into the other element. For instance, the sidewalls of the recess are laterally aligned with the electronic component since an imaginary horizontal line intersects the sidewalls of the recess and the electronic component, regardless of whether another element is between the sidewalls of the recess and the electronic component and is intersected by the line, and regardless of whether another imaginary horizontal line intersects the electronic component but not the sidewalls of the recess or intersects the sidewalls of the recess but not the electronic component. Likewise, the via openings are aligned with the contact pads or bumps of the electronic component.

The phrase "in close proximity to" refers to a gap between elements not being wider than the maximum acceptable limit. As known in the art, when the gap between the sidewalls of the recess and the electronic component is not narrow enough, the location error of the electronic component due to the lateral displacement of the electronic component within the gap may exceed the maximum acceptable error limit. In some cases, once the location error of the electronic component goes beyond the maximum limit, it is impossible to align the predetermined portion of the electronic component with a laser beam, resulting in the electrical connection failure between the electronic component and the buildup circuitry. According to the pad size of the electronic component, those skilled in the art can ascertain the maximum acceptable limit for a gap between the electronic component and the sidewalls of the recess through trial and error to ensure the conductive vias being aligned with the contact pads of the electronic component. Thereby, the description "the sidewalls of the recess are in close proximity to the peripheral edges of the electronic component" means that the gap between the peripheral edges of the electronic component and the sidewalls of the recess is narrow enough to prevent the location error of the electronic component from exceeding the maximum acceptable error limit. For instance, the gaps in between the electronic component and the sidewalls of the recess may be in a range of about 5 to 50 microns.

The phrases "electrical connection", "electrically connected" and "electrically coupled" refer to direct and indirect electrical connection. For instance, in the recess-down position, the first conductive traces directly contact and are electrically connected to the contact pads or bumps of the electronic component, and the second conductive traces are spaced from and electrically connected to the contact pads or bumps of the electronic component by the first conductive traces and the metal posts or plated through holes.

The "first direction" and "second direction" do not depend on the orientation of the component-in-recess subassembly or the wiring board, as will be readily apparent to those skilled in the art. For instance, the first surface of the dielectric base faces the first direction and the second surface of the dielectric base faces the second direction regardless of whether the component-in-recess subassembly or the wiring board is inverted. Thus, the first and second directions are opposite one another and orthogonal to the lateral directions. Furthermore, the first direction is the downward direction and the second direction is the upward direction in the recess-up position, and the first direction is the upward direction and the second direction is the downward direction in the recess-down position.

The wiring board according to the present invention has numerous advantages. For instance, the minimal height of the metal posts can be reduced by the amount equal to the depth of the recess such that a higher number of metal posts can be disposed. The sidewalls of the recess can provide critical placement accuracy for the electronic component. The direct electrical connection without solder between the electronic component and the first or second buildup circuitry is advantageous to high I/O and high performance. The dual buildup circuitries can provide signal routing with simple circuitry patterns or flexible multi-layer signal routing with complex circuitry patterns. The plated through hole can provide vertical signal routing between the dual buildup circuitries, thereby providing the wiring board with stacking capability. The wiring board made by this method is reliable, inexpensive and well-suited for high volume manufacture.

The manufacturing process is highly versatile and permits a wide variety of mature electrical and mechanical connection technologies to be used in a unique and improved manner. The manufacturing process can also be performed without expensive tooling. As a result, the manufacturing process significantly enhances throughput, yield, performance and cost effectiveness compared to conventional techniques.

The embodiments described herein are exemplary and may simplify or omit elements or steps well-known to those skilled in the art to prevent obscuring the present invention. Likewise, the drawings may omit duplicative or unnecessary elements and reference labels to improve clarity.

What is claimed is:

1. A method of making a stackable wiring board, comprising:

providing a metal carrier having substantially parallel first and second surfaces in opposite first and second directions, respectively;

forming a protruded metal platform from the first surface of the metal carrier;

forming a dielectric base covering the protruded metal platform and the remaining first surface of the metal carrier, wherein the dielectric base has a first surface apart from the metal carrier and substantially parallel to the first and second surfaces of the metal carrier and an opposite second surface adjacent to the metal carrier;

forming an array of metal posts over the second surface of the dielectric base by removing a portion of the metal carrier;

forming a recess in the dielectric base by removing the protruded metal platform and a corresponding portion of the metal carrier, wherein the corresponding portion of the metal carrier covers the protruded platform in the second direction, and the recess has a floor that is substantially parallel to the first surface of the dielectric base and a periphery defining interior sidewalls that extend from the floor to the second surface of the dielectric base;

attaching an electronic component in the recess of the dielectric base by an adhesive, wherein the electronic component protrudes out from the recess and is substantially coplanar with the metal posts in the second direction, and the sidewalls of the recess confine the dislocation of the electronic component laterally; and
forming a first buildup circuitry over the first surface of the dielectric base from the first direction and a second buildup circuitry over the electronic component and the metal posts from the second direction, wherein one of the first and second buildup circuitries is electrically coupled to the electronic component, and the first buildup circuitry is electrically connected to the second buildup circuitry and includes conductive vias in the dielectric base.

2. The method of claim 1, further comprising a step of forming a metal layer on the floor of the recess before the step of attaching the electronic component in the recess, wherein the metal layer is thermally coupled to the first buildup circuitry through additional conductive vias in the dielectric base.

3. The method of claim 1, further comprising a step of forming an array of auxiliary metal pads from the first surface of the metal carrier before the step of forming the dielectric base, wherein the dielectric base also covers the auxiliary metal pads from the first direction, and the metal posts are formed on the auxiliary metal pads.

4. The method of claim 3, wherein the auxiliary metal pads have a thickness substantially equal to that of the protruded metal platform.

5. The method of claim 1, further comprising a step of forming a stiffener that covers the second surface of the dielectric base and sidewalls of the metal posts and the corresponding portion of the metal carrier before the step of forming the recess.

* * * * *